United States Patent [19]

Kanai et al.

[11] Patent Number: 5,358,987
[45] Date of Patent: Oct. 25, 1994

[54] POLYSILANE COMPOSITIONS

[75] Inventors: Masahiro Kanai, Tokyo; Hisami Tanaka, Yokohama; Harumi Sakou, Tokyo; Tatuyuki Aoike, Nagahama; Kouichi Matuda, Nagahama; Keishi Saitou, Nagahama; Mituyuki Niwa, Nagahama; Masahumi Sano, Nagahama, all of Japan

[73] Assignee: Canon Kabushiki Kaisha, Tokyo, Japan

[21] Appl. No.: 689,879

[22] Filed: Jun. 12, 1992

[30] Foreign Application Priority Data

Sep. 27, 1989 [JP] Japan .................. 1-249021
Dec. 11, 1989 [JP] Japan .................. 1-319003
Dec. 11, 1989 [JP] Japan .................. 1-319004

[51] Int. Cl.$^5$ ................................ C08K 5/17
[52] U.S. Cl. ............................ 524/254; 524/251; 524/252; 524/255; 524/257; 524/408; 524/409
[58] Field of Search ........... 524/408, 409, 251, 252, 524/254, 255, 257

[56] References Cited

U.S. PATENT DOCUMENTS 4,558,801 12/1985 Vilutis et al. .................. 220/404
4,618,551 10/1986 Stolka et al. .................. 430/58
5,159,042 10/1992 Tanaka et al. .................. 528/14

FOREIGN PATENT DOCUMENTS 62-269964 11/1987 Japan .
63-241549 10/1988 Japan .
63-285552 11/1988 Japan .
1-231059  9/1989 Japan .

OTHER PUBLICATIONS

West et al., JACS, 103, pp. 7352–7354 (1981).
McGraw-Hill Dictionary of Scientific and Technical Terms, Third Edition, pp. 9 and 481.

Primary Examiner—Melvyn I. Marquis
Attorney, Agent, or Firm—Fitzpatrick, Cella, Harper & Scinto

[57] ABSTRACT

A new polysilane composition usable as an organic semiconductor which contains a specific polysilane compound of 6000 to 200000 in a weight average molecular weight in which all the substitutional groups and end groups being substituted by specific organic groups not containing oxygen atom, said polysilane compound not containing chlorine atom, and an acceptor level forming material or/and a donor level forming material.

8 Claims, No Drawings

POLYSILANE COMPOSITIONS

FIELD OF THE INVENTION

The present invention relates to a new composition containing a specific polysilane compound and a dopant. More particularly, the present invention relates to a new composition containing a new polysilane compound of 6000 to 200000 in a weight average molecular weight in which all the substitutional groups and end groups being substituted by specific organic groups not containing oxygen atoms and an acceptor level forming material or/and a donor level forming material. The present invention includes a process of producing said composition. The composition of the present invention is useful as an organic semiconductor.

BACKGROUND OF THE INVENTION

Polysilane compounds were reported to be insoluble in solvents in (The Journal of American Chemical Society, 125, pp. 2291 (1924)). Thereafter, it was reported that polysilanes are soluble in solvents and films can be made of them (The Journal of American Ceramic Society, 61, pp. 504 (1978)). Since then, the public attention has been focussed on polysilane compounds. Further, as for polysilane compounds, it was reported that they can be dissociated with ultraviolet rays, and research was made on utilization of them in resists (Japanese Unexamined Patent Publications Sho.60(1985)-98431 and Sho.60(1985)-119550 ). Further, it was reported that polysilane compounds have photosemiconductor characteristics in which carriers are mobile due to $\sigma$-bonds of their principal chains (Physical Review B, 35, pp. 2818 (1987)). And these polysilane compounds have been expected to be usable also in electrophotographic photosensitive members. However, in order that polysilane compounds be applicable in electronic materials, those polysilane compounds are required to be soluble in solvents and capable of providing films which are free of minute defects and excel in homogeneity. As for the electronic materials, any minute defect is not allowed and because of this, polysilane compounds to be used in the preparation of such electronic materials are required to be high quality polysilane compounds, which can be structurally defined also with respect to substituents and do not cause any abnormality upon film formation. There various reports have been made for synthesis of polysilane compounds. Those polysilane compounds reported are still problematic in using them in electronic materials. There are reported low-molecular weight polysilane compounds in which all the Si radicals being substituted by organic groups (The Journal of American Chemical Society, 94, (11), pp. 3806 (1972) and Japanese Patent Publication Sho. 63(1988)-38033). Those described in the former literature are of the structure in which the end group of dimethylsilane being substituted by a methyl group. Those described in the latter literature are of the structure in which the end group of dimethylsilane being substituted by an alcoxy group. Any of them is 2 to 6 in polymerization degree and does not exhibit characteristics as the polymer. Particularly in this respect, any of them does not have an ability of forming a film as it is and is not industrially applicable. High-molecular weight polysilane compounds of the structure in which all the Si radicals being substituted by organic groups have been recently reported (Nikkei New Material, pp. 46, Aug. 15 of 1988 ). These compounds are synthesized through specific intermediates to cause reduction in their yield and it is difficult to mass-produce them on the industrial scale.

In addition, methods of synthesizing polysilane compounds are reported (The Journal of Organometallic Chemistry, pp. 198 C27 (1980) and The Journal of Polymer Science, Polymer Chemistry Edition vol. 22, pp. 159–170 (1984))). However, any of these synthetic methods is directed only to condensation reaction of the polysilane principal chain but does not touch upon the end groups. And, in any of these synthetic methods, unreacted chlorine radicals and by-products due to side reactions are caused and it is difficult to stably obtain polysilane compounds as desired.

Use of polysilane compounds as a photoconductive material is reported (U.S. Pat. No. 4,618,551, U.S. Pat. No. 4,772,525 and Japanese Unexamined Patent Publication Sho. 62(1987)-269964). However, in any of these cases, occurrence of undesirable negative effects due to unreacted chlorine radicals and by-products caused by side reactions are considered.

Particularly, in U.S. Pat. No. 4,618,551, polysilane compounds are used in electrophotographic photosensitive members and an extremely high voltage of 1000 V is applied upon use of those photosensitive members, although a voltage of 500 to 800 V is applied in an ordinary electrophotographic copying machine. It is considered that this is done in order to prevent occurrence of spotted abnormal phenomena on images reproduced since defects due to the structural defects of the polysilane compound will cause in the electrophotographic photosensitive member at an ordinary potential. In Japanese Unexamined Patent Publication Sho. 62(1987)-269964, it is described that electrophotographic photosensitive members are prepared by using polysilane compounds and a photosensitivity is observed for each of them. However, none of those electrophotographic photosensitive members is sufficient in photosensitivity and is inferior to the known selenium photosensitive member or the known organic photosensitive member in any respect.

As above described, there are a number of unsolved problems for any of the known polysilane compounds to be utilized in the electronic materials. Thus, any polysilane compound which can be desirably used for industrial purposes has not yet been realized.

SUMMARY OF THE INVENTION

An object of the present invention relates is to providing a new polysilane composition usable as an organic semiconductor which contains a new polysilane compound having a weight average molecular weight of 6000 to 200000 and not containing chlorine atom in which all the substitutional groups and end groups being substituted by specific oxygen-free organic groups and an acceptor level forming material and/or a donor level forming material.

Another object of the present invention is to provide said polysilane composition which has a good solubility in solvents and which makes it possible to form a semiconductor film having excellent characteristics.

A further object of the present invention is to provide said polysilane composition which is usable in the preparation of various electronic devices.

A still further object of the present invention is to provide a method for producing said polysilane composition.

The present invention attains the above objects, and the polysilane composition to be provided by the present invention is of the constitution which will be described below.

That is, it is a polysilane composition containing a polysilane compound having a weight average molecular weight of 6000 to 200000 which is represented by the following general formula (I) and an acceptor level forming material or/and a donor level forming material, in which the content of said acceptor level forming material or said donor level forming material or the total content of the two materials is $1 \times 10^{-4}$ to 10 parts by weight versus 100 parts by weight of said polysilane compound.

[Wherein, $R_1$ stands for an alkyl group of 1 to 2 carbon atoms; $R_2$ stands for an alkyl group, cycloalkyl group, aryl group or aralkyl group of 3 to 8 carbon atoms; $R_3$ stands for an alkyl group of 1 to 4 carbon atoms; $R_4$ stands for an alkyl group of 1 to 4 carbon atoms; A and A' respectively stands for an alkyl group, cycloalkyl group, aryl group or aralkyl group of 4 to 12 carbon atoms wherein the two substituents may be the same or different one from the other; and each of n and m is a mole ratio showing the proportion of the number of respective monomers versus the total of the monomers in the polymer wherein $n+m=1$, $0 < n \pm 1$ and $0 \pm m < 1$.]

In the polysilane compound represented by the general formula (I), A and A' are respectively an alkyl group or a cycloalkyl group of 5 to 12 carbon atoms.

As the acceptor level forming material, there is used a halogen compound represented by the general formula: MXa (wherein, M is an element belonging to the group VA of the periodic table, X is a halogen element, and a is an integer which is determined depending upon the valence number of the element M.). Likewise, as the donor level forming material, there is used an amine compound.

DETAILED EXPLANATION OF THE PREFERRED EMBODIMENTS

The polysilane compound to be used in the present invention which is expressed by the foregoing general formula (I) and has a weight average molecular weight of 6000 to 200000 has neither chlorine-containing group nor side reaction-causing group, and all the Si radicals thereof are substituted by specific organic groups not containing any oxygen atom. The polysilane compound is not noxious, easily soluble in aromatic solvents such as toluene, benzene, xylene, etc., halogenated solvents such as dichloromethane, dichloroethane, chloroform, carbon tetrachloride, etc., and other solvents such as tetrahydrofuran (THF), dioxane, etc., and has an excellent film-forming ability. And, the film formed of the polysilane compound is homogenous, uniform in thickness, has an excellent heat-resistance and excels in hardness and toughness.

Thus, the polysilane compound to be used in the present invention can be employed in the preparation of various electronic devices, medical devices, etc., and it is a high molecular weight compound of high industrial value.

Said electronic device includes organic photoconductive members, electric conductive members, photoresists, light information memory elements, etc.

As described above, the polysilane compound to be used in the present invention is represented by the foregoing general formula (I) and has a weight average molecular weight of 6000 to 200000. In the viewpoints of desirable solubility in solvents and desirable film-forming ability, the polysilane compound is desired to be one that has a weight average molecular weight preferably of 8000 to 120000, most preferably of 10000 to 80000.

As for the weight average molecular weight, polysilane compounds of less than 6000 in weight average molecular weight do not exhibit polymer characteristics and do not have a film-forming ability. On the other hand, polysilane compounds exceeding 200000 in weight average molecular weight are poor with respect to solubility in solvents, and it is difficult to form films therefrom.

In the case where a film especially excelling in toughness is desired to be formed, it is desired to selectively use a polysilane compound of the foregoing formula (I) wherein the end groups A and A' are groups selected from the group consisting of alkyl groups having 5 to 12 carbon atoms, cycloalkyl groups, aryl groups and aralkyl groups respectively having 5 to 12 carbon atoms. The most desirable polysilane compounds in this case are those in which the end groups A and A' are groups selected from the group consisting of alkyl groups having 5 to 12 carbon atoms and cycloalkyl groups having 5 to 12 carbon atoms.

The foregoing polysilane compound to be used in the present invention can be synthesized in the following manner. That is, under high purity inactive atmosphere containing neither oxygen nor water, dichlorosilane monomer in a solvent is contacted with a condensation catalyst comprising an alkaline metal to conduct dehalogenation and condensation polymerization, to thereby synthesize an intermediate polymer. The intermediate polymer thus obtained is separated from unreacted monomer and is reacted with a selected halogenating organic reagent in the presence of a condensation catalyst comprising an alkaline metal to condense an organic group to the terminals of the intermediate polymer, thereby obtaining the polysilane compound.

The polysilane composition of the present invention can be obtained by adding to the polysilane compound thus obtained a halogen compound represented by the foregoing general formula: MXa as the acceptor level forming material or/and an amine compound as the donor level forming material.

In the above synthesizing process, as any of the foregoing dichlorosilane monomer, intermediate polymer, halogenating organic reagent and alkaline metal condensation catalyst is highly reactive with oxygen and water, the foregoing polysilane compound to be used in the present invention cannot be obtained under such atmosphere wherein oxygen and/or water are present.

Therefore, the foregoing procedures of obtaining the polysilane compound to be used in the present invention is necessary to be carried out under the atmosphere containing neither oxygen nor water. Thus, due regard is to be made such that all the reagents to be used and the reaction vessel to be used contain neither oxygen nor water and the reaction system is not incorporated with oxygen or/and water during the synthesizing process. Specifically, with respect to the reaction vessel to be used, it is subjected to vacuum suction and argon gas substitution in a blow box, thereby eliminating adsorption of water or/and oxygen in the inside of said vessel. As for the argon gas used in any case, it is necessary that the argon gas is dehydrated by passing it through a silica gel column, oxygen is then removed therefrom by passing the dehydrate through a column charged with copper power which is maintained at 100° C. and the argon gas thus treated is used.

As for the dichlorosilane monomer as the starting material, prior to introducing it into the reaction system, oxygen is removed therefrom by subjecting it to vacuum distillation with the use of said treated argon gas free of oxygen, and thereafter it is introduced into the reaction system. Likewise, as for the for halogenating organic reagent to be used for introducing a specific organic group and the solvent to be used, they are also treated to be free of oxygen in the same manner as in the above case of treating the dichlorosilane monomer and are introduced into the reaction system. As for the dehydrogenation of the solvent, it is desired to be treated such that after being subjected to vacuum distillation with the use of the foregoing argon gas, the solvent is further treated with metallic sodium to be completely free of water.

As the foregoing condensation catalyst, it is desired to use a wire-like shaped alkaline metal or preferably chipped alkaline metals in view of enlarging the surface area of the catalyst. In order to obtain said wired alkaline metal or chipped alkaline metals, the starting alkaline metal is wired or chipped in a paraffinic solvent free of oxygen, and the resultant is used while taking care not to cause oxidation thereof.

As the starting dichlorosilane monomer to be used for producing the polysilane compound of the foregoing formula (I) to be used in the present invention, there is selectively used a silane compound represented by the general formula: $R_1R_2SiCl_2$ which will be later detailed or in addition, also selectively used a silane compound represented by the general formula: $R_3R_4SiCl_2$ which will be later detailed.

As the foregoing condensation catalyst, an alkaline metal capable causing dehalogenation and providing condensation reaction is desirably used. Specific examples of such alkaline metal are lithium, sodium and potassium, among these, lithium and sodium being the most preferred.

The foregoing halogenating organic reagent is used for the introduction of a substituent represented by the A and a substituent represented by the A'. As such halogenating organic reagent, there is used a relevant compound selected from the group consisting of halogenated-alkyl compounds, halogenated-cycloalkyl compounds, halogenated-aryl compounds and halogenated-aralkyl compounds. That is, a relevant compound selected from the compounds represented by the general formula: A-X and/or a compound selected from the compounds represented by the general formula: A'-X (wherein X is Cl or Br) which will be later exampled.

As for the foregoing dichlorosilane monomer represented by the general formula: $R_1R_2SiCl_2$ or the dichlorosilane monomer represented by the general formula: $R_3R_4SiCl_2$ which is used at the time of synthesizing the foregoing intermediate polymer, they are dissolved in predetermined solvents and introduced into the reaction system. As such solvent, nonpolar paraffinic hydrocarbon solvents are desirably used. Specific examples of such nonpolar solvent are n-hexane, n-octane, n-nonane, n-dodecane, cyclohexane, cyclooctane, etc.

The intermediate polymer synthesized is insoluble in any of these solvents and thus, it can be effectively separated from the unreacted dichlorosilane monomer.

At the time of reacting the intermediate polymer separated from the unreacted dichlorosilane monomer with the halogenating organic reagent, they are dissolved in the same solvent and they are reacted. In this case, there is desirably used an aromatic solvent such as benzene, toluene, xylene, etc. as said solvent.

In order to obtain a desired intermediate by condensating the foregoing dichlorosilane monomer with the use of the foregoing alkaline metal catalyst, the polymerization degree of the resulting intermediate polymer can be controlled as desired by properly adjusting the reaction temperature and the reaction period of time. However, as for the reaction temperature, it is desired to be regulated in the range of from 60° C. to 130° C.

A preferred embodiment of the method for producing the foregoing polysilane compound represented by the formula (I) to be used in the present invention will be explained in the following.

That is, the method for producing the foregoing polysilane compound to be desirably used in the present invention comprises the steps of (a) producing the intermediate polymer and (b) introducing the substituents A and A' to the terminals of said intermediate polymer.

The step (a) can be carried out as follows: That is, the inside of the reaction system of a reaction vessel is made substantially free of oxygen and water, charged with argon gas and the gas pressure thereof is maintained at a predetermined value. A paraffinic solvent free of oxygen and a condensation catalyst free of oxygen are introduced into the reaction system, and dichlorosilane monomer(s) free of oxygen is introduced thereinto. The reactants thus introduced are heated to a predetermined temperature while mixing them to cause condensation of said monomer. In this case, the condensation degree of said dichlorosilane monomer is controlled as desired by properly regulating the reaction temperature and the reaction period of time, to thereby obtain an intermediate polymer having a desired polymerization degree.

The reaction in this case is performed in the manner as shown in the following reaction formula (i), wherein the chlorine radicals of the dichlorosilane monomers and the condensation catalyst are reacted to cause dechlorination reaction wherein the Si radicals are repeatedly condensated and polymerized, thereby obtaining an intermediate polymer.

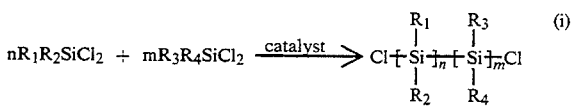

The reaction procedures in the above are made such that the condensation catalyst (alkaline metal) is firstly placed in the paraffinic solvent, into which the dichlorosilane monomers are dropwise introduced while stirring the reaction mixture and maintaining it at an elevated temperature. The polymerization degree of the resultant is confirmed by sampling the reaction liquid.

The confirmation of the polymerization degree can be simply conducted by observing the state of the sampled reaction liquid if a film can be formed or not therefrom. When condensation proceeds to form a polymer, said polymer becomes precipitated in the form of white solid in the reaction liquid. When such white solid is precipitated as desired, the reaction liquid containing the white solid is cooled and decanted to separate the precipitate from the solvent. Thus, there is afforded an intermediate polymer. Then, the foregoing step (b) is carried out. Specifically, the intermediate polymer thus obtained is subjected to dechlorination condensation with the use of the halogenating organic reagent and the condensation catalyst (alkaline metal) to thereby substitute the end groups of said intermediate polymer by predetermined organic groups. The reaction in this case is performed in the way as shown in the following reaction formula (ii).

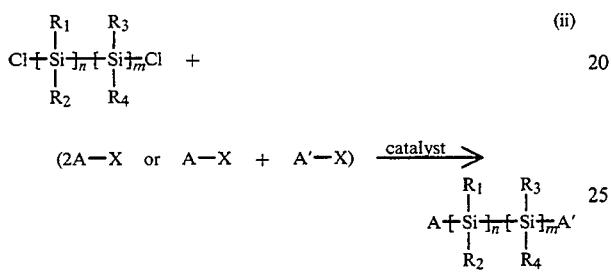
(ii)

each of n and m is a mole ratio showing the proportion of the number of respective monomers versus the total of the monomers in the polymer wherein $n+m=1$, $0<n\leq$ and $0\leq m<1$.

Specifically in this respect, the intermediate polymer obtained by condensation of the dichlorosilane monomers is dissolved in the aromatic solvent. Then, the foregoing condensation catalyst (alkaline metal) is added to the solution, and the foregoing halogenating organic reagent is added dropwise at room temperature. Wherein said halogenating organic reagent is added in an excessive amount of 0.01 to 0.1 holds over the amount of the starting monomer in order to compete condensation reaction between the end groups of the polymer. The reaction mixture is gradually heated, and it is stirred for an hour while maintaining it at a temperature of 80° C. to 100° C. to thereby perform the reaction as desired.

After the reaction is completed, methanol is added in order to remove the alkaline metal as the catalyst. Then, the polysilane compound resulted is extracted with toluene and purified by using a silica gel column. Thus, there is obtained an objective polysilane compound to be used in the present invention.

SPECIFIC EXAMPLES OF THE $R_1R_2$ SiCl$_2$ and $R_3R_4$ SiCl$_2$

Note: Among the following compounds, compounds of a-2 to 16, 18, 20, 21, 23 and 24 are used as the dichlorosilane monomer of the general formula: $R_1R_2SiCl_2$, and compounds of a-1, 2, 11, 17, 19, 22, 23 and 25 as the dichlorosilane monomer of the general formula: $R_3R_4SiCl_2$.

$(CH_3)_2SiCl_2$    a-1

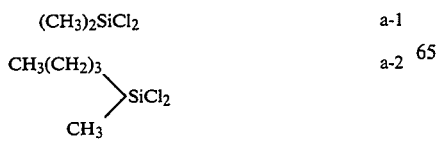
a-2

-continued

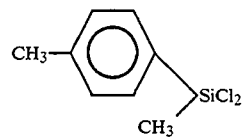
a-3

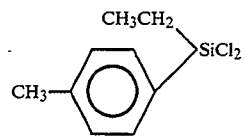
a-4

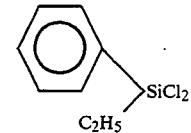
a-5

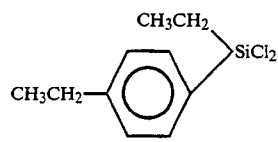
a-6

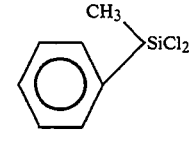
a-7

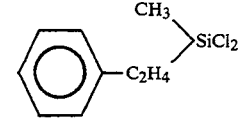
a-8

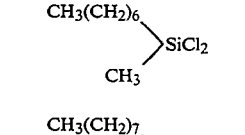
a-9

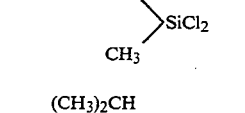
a-10

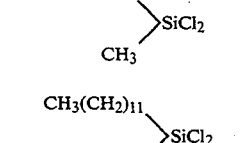
a-11

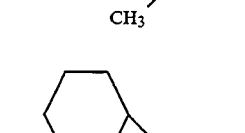
a-12

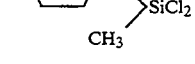
a-13

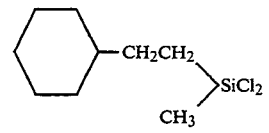
a-14

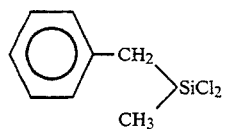 a-15
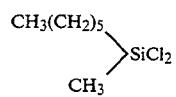 a-16
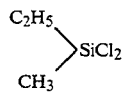 a-17
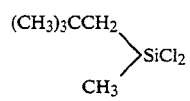 a-18
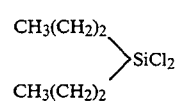 a-19
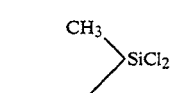 a-20
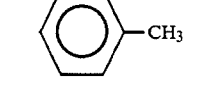 a-21
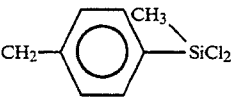 a-22
((CH₃)₂CH)₂SiCl₂
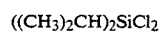 a-23
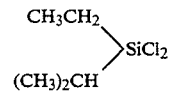 a-24
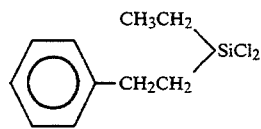
((CH₃)₃C)₂SiCl₂  a-25
Specific Examples of the A—X and the A'-X
(CH₃)₂CHCH₂Cl  b-1
CH₃(CH₂)₄Cl  b-2
CH₃(CH₂)₅Cl  b-3
CH₃(CH₂)₁₀Cl  b-4
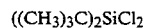 b-5
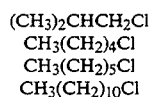 b-6
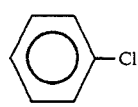 b-7
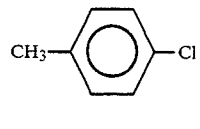 b-8
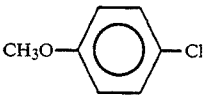 b-9
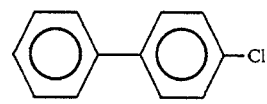 b-10
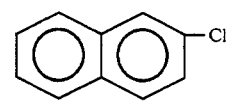 b-11
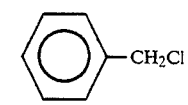 b-12
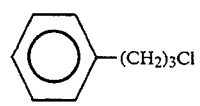 b-13
CH₃(CH₂)₅Br  b-14
CH₃(CH₂)₁₀Br  b-15
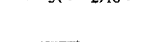 b-16
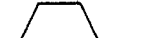 b-17
Specific Examples of the polysilane compound to be used in the present invention
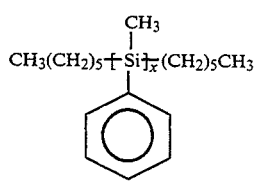 c-1
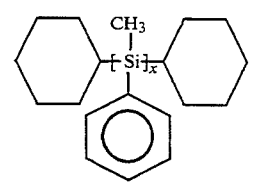 c-2

-continued
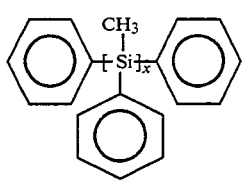 c-3
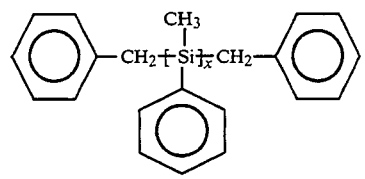 c-4
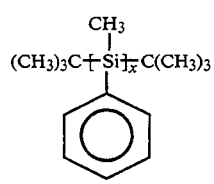 c-5
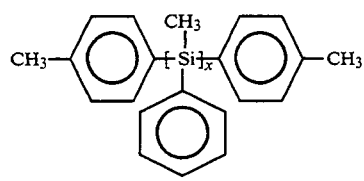 c-6
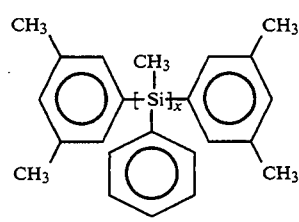 c-7
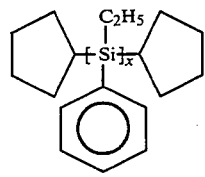 c-8
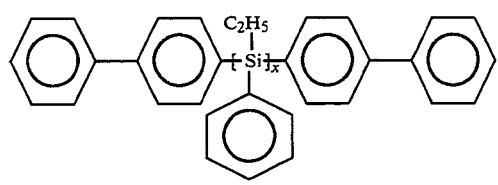 c-9
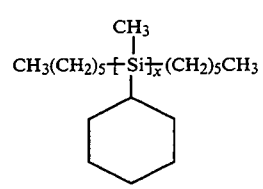 c-10
-continued
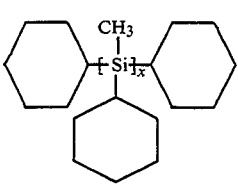 c-11
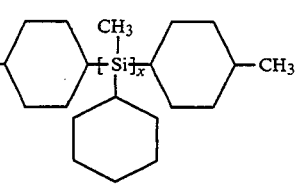 c-12
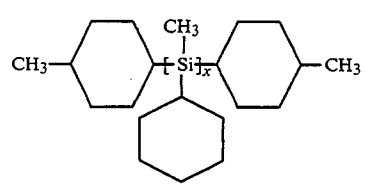 c-13
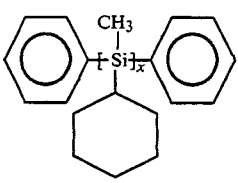 c-14
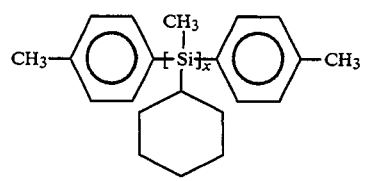 c-15
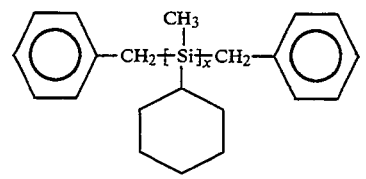 c-16
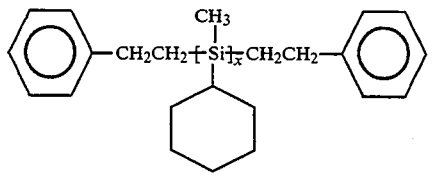 c-17
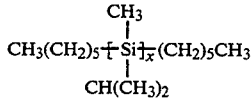 c-18
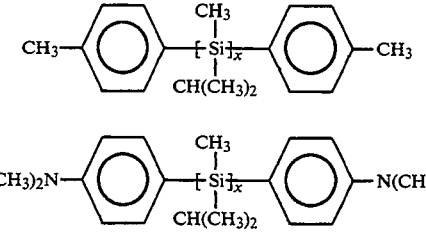 c-19
c-20

-continued
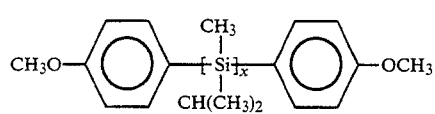 c-21
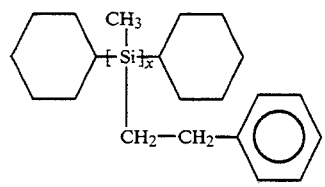 c-22
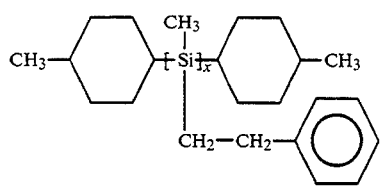 c-23
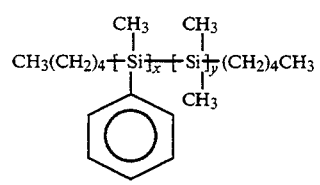 c-24
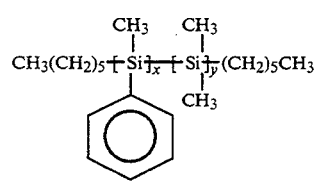 c-25
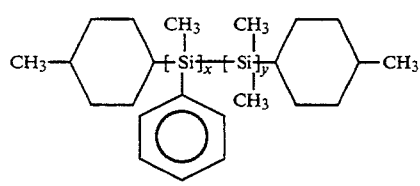 c-26
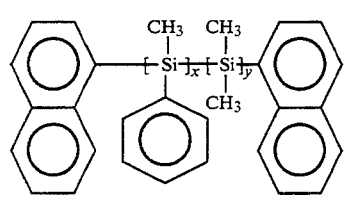 c-27
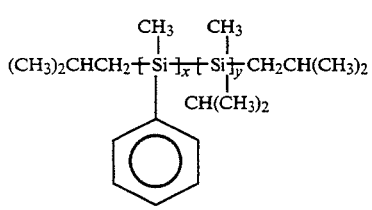 c-28
-continued
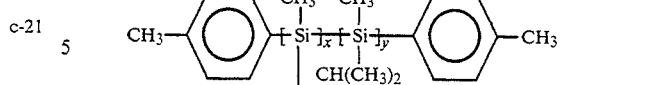 c-29
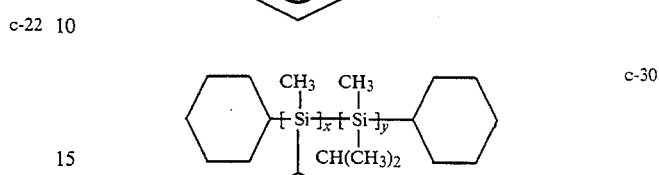 c-30
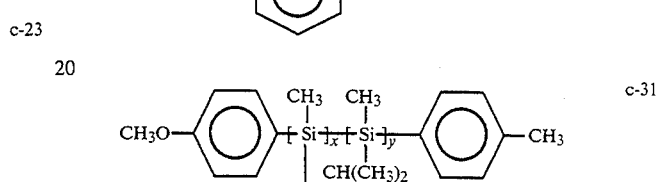 c-31
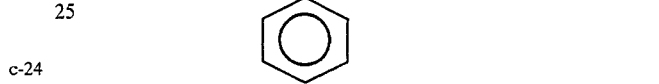 c-32
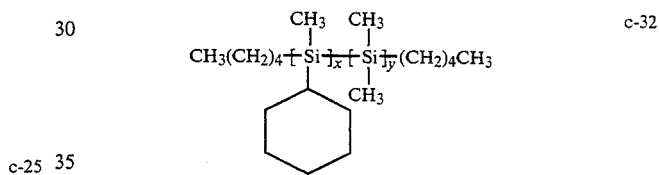 c-33
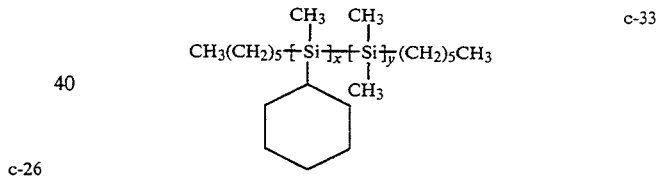 c-34
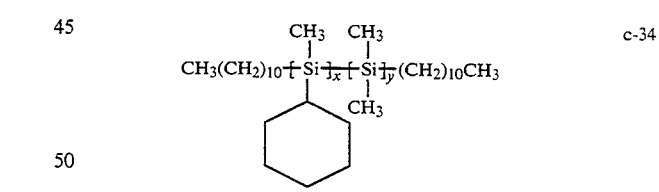 c-35
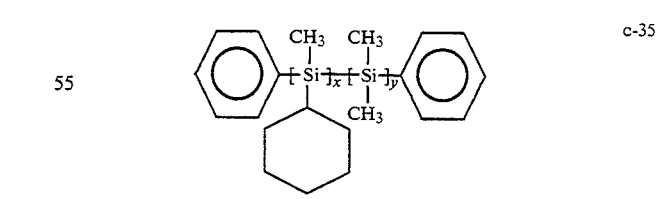 c-36

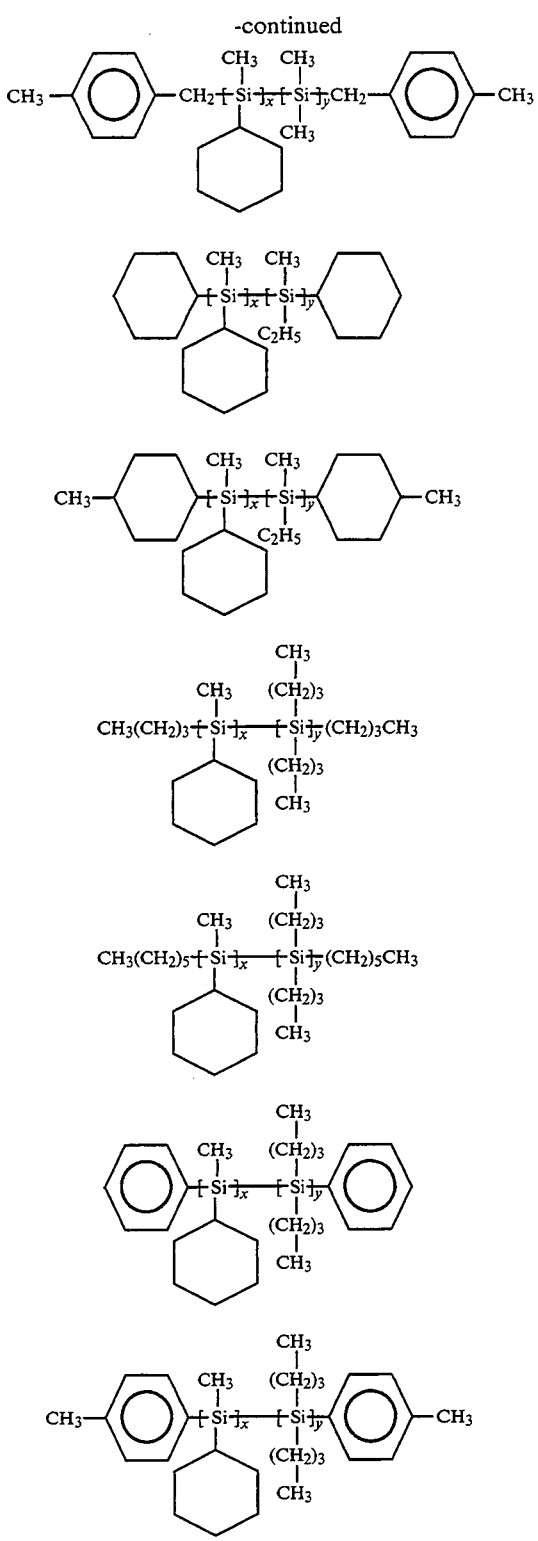

Note: X and Y in the above structural formulas respectively represents the number of a polymeric unit of the monomer. n is obtained by the calculation equation: X/(X+Y), and m is obtained by the calculation equation: Y/(X+Y).

EXAMPLES OF SYNTHESIS

In the following, detailed explanation will be made about synthesis of the polysilane compound to be used in the present invention with reference of examples of synthesis.

EXAMPLE OF SYNTHESIS 1

A three-necked flask was placed in a blow box which had been vacuum-aspirated and charged with argon gas. A reflux condenser, a temperature gage and a dropping funnel were attached to the device. And argon gas was passed through a by-pass pipe of the dropping funnel.

100 g of dehydrated dodecane and 0.3 moles of wirelike shaped metallic sodium were introduced into the three-necked flask and heated to 100° C. while stirring. Then a solution prepared by dissolving 0.1 mole of dichlorosilane monomer (product by Chisso Kabushiki Kaisha)(a-7) in 30 g of dehydrated dodecane was dropwise and slowly added to the reaction system.

After the addition was completed, the reactants were subjected to condensation polymerization at 100° C. for an hour, wherein white solids were precipitated. Thereafter the resultant was cooled, and the dodecane was removed by way of decantation. 100 g of dehydrated toluene was added to dissolve the white solids, to which 0.01 mole of metallic sodium was added. Then, a solution prepared by dissolving 0.01 mole of n-hexylchloride (product by Tokyokasei Kabushiki Kaisha)(b-3) in 10 ml of toluene was dropwise and slowly added to the reaction system while stirring, followed by heating at 100° C. for an hour while continuing the stirring. After cooling, 50 ml of methanol was dropwise and slowly added to treat excessive metallic sodium. As a result, there were formed a suspended phase and a toluene phase. The toluene phase was separated, subjected to vacuum concentration, and purified by way of chromatography development using a silica gel column to obtain a product corresponding to a polysilane compound No. 1 (C-1). The yield was 65%.

This polysilane compound was subjected to THF development by a known GPC method to examine the weight average molecular weight thereof. As a result, it was 75,000 (wherein polystyrene was made to be the reference standard).

A KBr pellet of the product was prepared and it was set to a Nicolet FT-IR 750 (product by Nicolet Japan Co., Ltd.) to examine its IR spectrum. Further, a specimen of the product was dissolved in $CDCl_3$ and the resultant was set to a FT-NMR FX-90Q (product by JEOL, Ltd.) to examine its NMR spectrum, thereby performing the identification of the polysilane compound. The results obtained are shown in Table 4.

For the polysilane compound synthesized in this example of synthesis, there was not found any IR absorption belonging to unreacted Si-Cl bond, Si-O-Si bond or Si-O-R bond of by-products.

EXAMPLE OF SYNTHESIS 2

A three-necked flask was placed in a blow box which had been vacuum-aspirated and charged with argon gas. A reflux condenser, a temperature gage and a dropping funnel were attached to the device. Argon gas was passed through a by-pass pipe of the dropping funnel.

100 g of dehydrated dodecane and 0.3 moles of metallic lithium of 1 mm in size were introduced into the three-necked flask and heated to 100° C. while stirring. Then, a solution prepared by dissolving 0.1 mole of dichlorosilane monomer (product by Chisso Kabushiki Kaisha)(a-7) in 30 g of dehydrated dodecane was dropwise and slowly added to the reaction system. After its addition being completed, the reactants were subjected to condensation polymerization at 100° C. for two hours, wherein white solids were precipitated. The resultant was cooled, and the dodecane was removed by way of decantation. 100 g of dehydrated toluene was added to dissolve the white solids, to which 0.02 moles of metallic lithium was added. Then, a solution prepared by dissolving 0.02 moles of chlorobenzene (product by Tokyo Kasei Kabushiki Kaisha)(b-7) in 10 ml of toluene was dropwise and slowly added to the reaction system while stirring, followed by heating at 80° C. for an hour while continuing the stirring. After cooling, 50 ml of methanol was dropwise and slowly added to treat excessive metallic lithium. As a result, there were formed a suspended phase and a toluene phase. The toluene phase was separated, subjected to vacuum concentration, and purified by chromatography development using a silica gel column to obtain a product corresponding to a polysilane compound No. 2 (C-3). The yield was 72%. Its weight average molecular weight was examined in the same manner as in Example of Synthesis 1. As a result, it was 92,000. Further, the product was identified in the same manner as in Example of Synthesis 1. The results obtained are shown in Table 4.

For this polysilane compound, there was not found any IR absorption belonging to unreacted Si-Cl bond, Si-O-Si bond or Si-O-R bond of by-products.

EXAMPLE OF SYNTHESIS 3

A three-necked flask was placed in a blow box which had been vacuum-aspirated and charged with argon gas. A reflux condenser, a temperature gage and a dropping funnel were attached to the device. Argon gas was passed through a by-pass pipe of the dropping funnel.

100 g of dehydrated n-hexane and 0.3 moles of metallic sodium of 1 mm in size were introduced into the three-necked flask and heated to 80° C. while stirring. Then, a solution prepared by dissolving 0.1 mole of dichlorosilane monomer (product by Chisso Kabushiki Kaisha)(a-7) in dehydrated n-hexane was dropwise and slowly added to the reaction system. After the addition was completed, the reactants were subjected to condensation polymerization at 80° C. for 3 hours, wherein white solids were precipitated. The resultant was cooled, and the n-hexane was removed by way of decantation. 100 g of dehydrated toluene was added to dissolve the white solids, to which 0.01 mole of metallic sodium was added. Then, a solution prepared by dissolving 0.01 mole of benzyl chloride (product by Tokyo Kasei Kabushiki Kaisha)(b-12) in 10 ml of toluene was dropwise and slowly added to the reaction system while stirring, followed by heating at 80° C. for an hour while continuing the stirring. After cooling, 50 ml of methanol was dropwise and slowly added to treat excessive metallic sodium. As a result, there were formed a suspended phase and a toluene phase. The toluene phase was separated, subjected to vacuum concentration, and purified by chromatography development using a silica gel column to obtain a product corresponding to a polysilane compound No. 3 (C-4). The yield was 61%. Further, the product was identified in the same manner as in Example of Synthesis 1. The results obtained are shown in Table 4.

For this polysilane compound, there was not found any IR absorption belonging to unreacted Si-Cl bond, Si-O-Si bond or Si-O-R bond of by-products.

EXAMPLES OF SYNTHESIS 4 AND 5

The procedures of Example of Synthesis 3 were repeated, except that the dichlorosilane monomer and each of the end group treating agents shown in Table 1 were used. The yield of each of the polysilanes synthesized, its weight average molecular weight, IR spectrum and NMR spectrum measured in the same manner as in Example of Synthesis 1 are shown in Table 4.

For each of the polysilane compounds, there was not found any IR absorption belonging to unreacted Si-Cl bond, Si-O-Si bond or Si-O-R bond of by-products.

COMPARATIVE EXAMPLE OF SYNTHESIS 1

The procedures of Example of Synthesis 3 were repeated, except that neither the condensation using the dichlorosilane monomer (product by Chisso Kabushiki Kaisha)(a-7) nor the end group treatment of the polymer were performed, to obtain a polysilane compound No. D-1. The yield was 60%. As a result of measuring its weight average molecular weight in the same manner as in Example of Synthesis 1, it was 46,000. Further, its identification was performed in the same manner as in Example of Synthesis 1. The results obtained are shown in Table 4.

As for this polysilane compound, there were observed IR spectra belonging to unreacted Si-Cl for the end group and belonging to Si-O-R of a by-product.

EXAMPLES OF SYNTHESIS 6 TO 10

The same condensation polymerization and purification as in Example of Synthesis 3 were performed, except for changing the dichlorosilane monomer, the reaction period of time and the end group-treating agent as shown in Table 2. There were obtained polysilane compounds Nos. 6 to 10.

The yield of each of the polysilane compounds synthesized, its weight average molecular weight, IR spectrum and NMR spectrum measured in the same manner as in Example of Synthesis 1 are shown in Table 4.

For each of the polysilane compounds, there was not found any IR absorption belonging to unreacted Si-Cl bond, Si-O-Si bond or Si-O-R bond of by-products.

COMPARATIVE EXAMPLE OF SYNTHESIS 2

The procedures of Example of Synthesis 6 were repeated, except that the reaction period of time was changed to 10 minutes, to thereby obtain a polysilane compound No. D-2.

The yield of the polysilane synthesized, its weight average molecular weight, IR spectrum and NMR spectrum measured in the same manner as in Example of Synthesis 1 are shown in Table 4.

For this polysilane compound, there was not found any IR absorption belonging to unreacted Si-Cl bond, Si-O-Si bond or Si-O-R bond of by-products.

EXAMPLES OF SYNTHESIS 11 TO 14

The procedures of Example of Synthesis 1 were repeated, except that dichlorosilane monomers and end group-treating agents were selectively used.

The yield of each of the polysilanes synthesized, its weight average molecular weight, IR spectrum and NMR spectrum measured in the same manner as in Example of Synthesis 1 are shown in Table 4.

The copolymerized ratio of the silane monomer in each case was obtained by the number of protons in the NMR.

COMPARATIVE EXAMPLE OF SYNTHESIS 3

A three-necked flask was placed in a blow box which had been vacuum-aspirated and charged with argon gas. A reflux condenser, a temperature gage and a dropping funnel were attached to the device. Argon gas was passed through a by-pass pipe of the dropping funnel.

100 g of dehydrated dodecane and 0.3 moles of wire-like shaped metallic sodium were introduced into the three-necked flask and heated to 100° C. while stirring. Then, a solution prepared by dissolving 0.1 mole of dichlorosilane monomer (product by Chisso Kabushiki Kaisha) in 30 g of dehydrated dodecane was dropwise and slowly added to the reaction system. After the addition was completed, the reactants were subjected to condensation polymerization at 100° C. for an hour, wherein white solids were precipitated.

After cooling, 50 ml of methanol was dropwise and slowly added to treat excessive metallic sodium.

Then, the resultant was subjected to filtration to thereby separate the white solids, which were repeatedly washed with n-hexane and methanol, to thereby obtain a polysilane compound No. D-3.

This polysilane compound was insoluble in organic solvents such as toluene, chloroform, THF, etc. Thus, its identification was performed by its IR spectrum. The results obtained are shown in Table 4.

COMPARATIVE EXAMPLE OF SYNTHESIS 4

A three-necked flask was placed in a blow box which had been vacuum-aspirated and charged with argon gas. A reflux condenser, a temperature gage and a dropping funnel were attached to the device. Argon gas was passed through a by-pass pipe of the dropping funnel.

100 g of dehydrated dodecane and 0.3 moles of wire-like shaped metallic sodium were introduced into the three-necked flask and heated to 100° C. while stirring.

Then, a solution prepared by dissolving 0.1 mole of dichlorosilane monomer (product by Chisso Kabushiki Kaisha) in 30 g of dehydrated dodecane was dropwise and slowly added to the reaction system. After its addition being completed, the reactants were subjected to condensation polymerization at 100° C. for an hour, wherein white solids were precipitated.

After cooling, 50 ml of methanol was dropwise and slowly added to treat excessive metallic sodium.

Then, the resultant was subjected to filtration to obtain the white solids, which were repeatedly washed with n-hexane and methanol to obtain a polysilane compound No. D-4.

This polysilane compound was insoluble in organic solvents such as toluene, chloroform, THF, etc. Thus, its identification was performed by its IR spectrum. The results obtained are shown in Table 4.

Any of the polysilane compounds synthesized in the above examples of synthesis has an excellent film-forming property and is capable of being formed into film, particle or fiber shapes.

Further, the polysilane compound can be optionally controlled to be of a desired conduction type by a specific acceptor level forming material or a specific donor level forming material.

As such acceptor level forming material (that is, an acceptor doping material), there can be illustrated halogen compounds represented by the foregoing general formula: $MX_a$ (wherein, M is an element belonging to the group VA of the periodic table, X is a halogen element, and a is an integer which is decided depending upon the valence number of the M.). Specific examples of the element M include N, P, As and Sb. Likewise, specific examples of the element X include F, Cl, Br and I. Further, specific examples of the halogen compound include $NF_3$, $NF_5$, $NCl_3$, $NCl_5$, $NBr_3$, $NBr_5$, $NI_3$, $PF_3$, $PF_5$, $PCl_3$, $PCl_5$, $PBr_3$, $PBr_5$, $PI_3$, $AsF_3$, $AsF_5$, $AsCl_3$, $AsBr_3$, $AsI_3$, $SbF_3$, $SbF_5$, $SbCl_3$, $SbCl_5$, $SbBr_3$ and $SbI_3$. These halogen compounds may be used either singly or in combination of two or more of them.

As such donor level forming material (that is, a donor doping material), there can be illustrated amine compounds. Specific examples include aliphatic primary amines represented by the general formula: $C_mH_{2m+1}NH_2$, aliphatic secondary amines represented by the general formula: $(C_mH_{2m+1})_2NH$, aliphatic tertiary amines represented by the general formula: $(C_mH_{2m+1})_3N$ (wherein, m is an integer of more than 1 in any of the cases), aliphatic unsaturated amines such as allylamine, diallylamine, triallylamine, etc.; alloyclio amines such as cyclopropylamine, cyclobutylamine, cyclopentylamine, cyclohexylamine, etc.; and aromatic amines such as aniline, methylaniline, dimethylaniline, ethylaniline, diethylaniline, o-, m- and p-toluidines, benzylamine, dibenzylamine, tribenzylamine, diphenylamine, triphenylamine, α-naphthylamine, β-naphthylamine, O-, m- and p-phenylenediamines, tetramethyl-p-phenylenediamine (TMPD), etc. These amine compounds can be used either singly or in combination of two or more of them.

The polysilane composition of the present invention can be obtained by adding a predetermined amount of the above doping material to the foregoing polysilane compound.

Any of the following three methods can be employed in order to obtain the polysilane composition of the present invention.

Method (1): in the case where the doping material is solid or liquid, the following method Gan be employed.

That is, firstly, the foregoing polysilane compound is dissolved in a dehydrated organic solvent of benzene, toluene or THF to prepare a solution (hereinafter referred to as "polysilane solution"). The concentration of the polysilane compound in the polysilane solution at this time is desired to be preferably $1 \times 10^{-3}$ g/l to $2 \times 10^3$ g/l, more preferably $1 \times 10^{-2}$ g/l to $1 \times 10^3$ g/l, or most preferably $1 \times 10^{-1}$ g/l to $5 \times 10^2$ g/l.

As for the doping material to be used, when it is liquid, it can be used as it is. However, in the case where the doping material to be used is either liquid or solid, it is desired that the doping material has a compatibility with the above solvent and that the doping material is dissolved in a sufficiently dehydrated solvent to be a solution (this solution will be hereinafter referred to as "dopant liquid"). The concentration of the doping material in the dopant liquid at this time is desired to be preferably $1 \times 10^{-6}$ g/l to $2 \times 10^2$ g/l, more preferably $2 \times 10^{-5}$ g/l to $1 \times 10^2$ g/l, or most preferably, $1 \times 10^{-5}$ g/l to $5 \times 10^1$ g/l. Then, the dopant liquid is dropwise added to the foregoing polysilane solution and sufficiently stirred, if necessary while heating (the solution thus treated will be hereinafter referred to as "treated liquid"). The temperature of heating the contents at this time is desired to be set at a temperature of more than the glass-transition temperature of the polysilane compound.

Thereafter, the treated liquid is transferred into a relevant making apparatus, wherein film-like, particle-like or fiber-like material is formed from the treated liquid, whereby obtaining the polysilane composition of the present invention.

Method (2): in the case where the doping material is solid or liquid and can be sublimated or gasified, the following method can be employed.

That is, firstly, the foregoing polysilane compound is dissolved in a dehydrated organic solvent of benzene, toluene or THF to prepare a polysilane solution. The concentration of the polysilane compound in the polysilane solution at this time is desired to be preferably $1 \times 10^{-3}$ g/l to $2 \times 10^3$ g/l, more preferably $1 \times 10^{-2}$ g/l to $1 \times 10^3$ g/l, or most preferably $1 \times 10^{-1}$ g/l to $5 \times 10^2$ g/l.

Then, the polysilane solution is transferred into a relevant making apparatus, wherein film-like, particle-like or fiber-like material is formed from the polysilane solution. The formed material is transferred into a relevant doping treating apparatus capable of being vacuum-sealed, wherein the formed material is exposed to an atmosphere comprising gas of the doping material, if necessary, while heating, to thereby absorb or impregnate the doping material in the formed material, whereby obtaining a desired polysilane composition. The atmosphere comprising gas of the doping material may be in the state of pressure, normal pressure or reduced pressure. And, the temperature of heat-treating the polysilane composition at this time is desired to be set a temperature of more than the glass-transition temperature of the polysilane compound.

Method (3): the polysilane composition of the present invention be obtained by subjecting the foregoing polysilane compound to doping treatment by an electrochemical method.

Specifically, a desired polysilane composition may be obtained by placing a polysilane moulding formed in the same manner as that described in the above method (2) in a relevant electrolytic solution as an electrode, placing an opposite metal electrode therein, and applying an electric voltage between these electrodes, to thereby make the polysilane moulding applied with doping treatment.

The above electrolytic solution is one that is obtained by dissolving in an organic solvent the doping material as an electrolyte. Specific examples of the organic solvent include acetonitrile, propylene carbonate, -butyrolactone, chlorobenzene, etc. The concentration of the electrolyte at this time is desired to be preferably $5 \times 10^{-6}$ g/l to $5 \times 10^2$ g/l, more preferably $5 \times 10^{-5}$ g/l to $5 \times 10^2$ g/l, or most preferably, $1 \times 10^{-4}$ g/l to $1 \times 10^2$ g/l.

And, specific examples of the above metal electrode include Pt, Au, Ag, Cu and Pd.

In this method (3), an acceptor level or/and a donor level can be formed by making the foregoing polysilane moulding to be an anode.

EXAMPLES

In the following, the present invention will be explained in more detail with reference to examples, but the present invention is not restricted to these examples.

EXAMPLE 1-1

In this example, there was prepared a polysilane composition of the present invention by the foregoing doping treatment method (1).

10 g of the polysilane compound (No. 1) obtained in Example of Synthesis 1 was introduced into a three-necked flask which had been sufficiently dried and charged with nitrogen, wherein 100 ml of tetrahydrofuran, which had been subjected to distillation drying twice, was dropwise added while stirring within nitrogen stream to thereby prepare a polysilane solution.

Then, 0.02 μl of $SbF_5$ in liquid form as a doping material was dropwise added through a microcylinder to the polysilane solution within nitrogen stream in the three-necked flask, followed by stirring at room temperature for 30 minutes.

After the stirring being terminated, the polysilane solution was transferred into a spin coating device placed in a glove box charged with nitrogen, wherein a 1.0 μm thick film comprising the polysilane composition was formed on a No. 7059 glass (1 inch × 3 inches in size) manufactured by Corning Glass Works Company as a substrate.

The film was subjected to vacuum drying treatment to obtain a specimen as Film Sample No. 1.

The above operations and procedures were repeated, except for changing the amount of the dopant liquid to be dropwise added to 0.5 μl, 5 μl, 500 μl, 3 ml and 5 ml respectively, there were prepared film specimens to be Film Samples Nos. 2 to 6 respectively comprising the polysilane composition.

Each of the specimens was set to a vacuum evaporation apparatus, wherein a 1000 Å thick comb-shaped electrode of 150 μm in gap width and 3 cm in length for measuring a conductivity and a 1000 Å thick parallel gap electrode of 100 μm in gap width and 5 mm in length for measuring a thermoelectric power were formed by an electron beam evaporation method, using Pt as an evaporation metal for forming such gap electrode at a vacuum of about $1 \times 10^{-5}$ Torr. At the time of evaporation, the specimen was not particularly heated.

The resultant was taken out, and a dark current was measured at an applied voltage of 30 V by using a pA METER HP 4140B to obtain a conductivity in dark $\sigma_d$ (S/cm). Further, a conduction type was observed by using a thermoelectric power measuring equipment. The measured results and the evaluated results were as shown in Table 5.

From these results, it has bee found that others than Samples Nos. 1 and 6 all exhibit good electric properties.

Further, there was performed a test to observe the adhesion of the film formed with the substrate by sticking a cellophane tape of 5 mm in width and 1 cm in length on the film comprising the polysilane composition, and 5 minutes after, removing the cellophane tape. As a result, any of the samples exhibited a good adhesion.

Further in addition, there was performed a scratching test by using a diamond needle. As a result, no scratch was observed until 2 g in stylus pressure.

EXAMPLE 1-2

There were prepared six polysilane composition film samples with different amounts of the doping material in the same operations and procedures as in Example 1-1, except for using the polysilane compound (No. 13) synthesized in Example of Synthesis 13 instead of the polysilane compound (No. 1).

For each of the samples obtained, measurement and evaluation were performed in the same manner as in Example 1-1. The results obtained were as shown in Table 5.

From the results obtained, it has been found that others than the film samples prepared with 0.02 μl and 5 ml in the amount of the dopant liquid to be dropwise added exhibit good electric properties.

And, the adhesion and the scratch resisting property were as good as those obtained in Example 1-1.

EXAMPLE 1-3

There were prepared six polysilane composition film samples with different amounts of the doping material in the same operations and procedures in Example 1-1, except for using the polysilane compound (No. 9) synthesized in Example of Synthesis 9 instead of the polysilane compound (No. 1) and a dopant liquid prepared by dissolving 0.5 g of $SbCl_3$ as a doping material in 1000 l of dehydrated benzene instead of the $SbF_5$ as the doping material. Wherein, the amount of the dopant liquid to be dropwise added was made to be 5 μl, 10 μl, 100 μl, 1 ml, 10 ml and 50 ml respectively.

For each of the samples obtained, measurement and evaluation were performed in the same manner as in Example 1-1. The results obtained were as shown in Table 5.

From the results obtained, it has been found that others than the film samples prepared with 5 μl and 50 ml in the amount of the dopant liquid to be dropwise added exhibit good electric properties.

And, the adhesion and the scratch resisting property were as good as those obtained in Example 1-1.

EXAMPLE 1-4

In this example, there was prepared a polysilane composition of the present invention by the foregoing doping treatment method (2).

10 g of the polysilane compound (No. 2) obtained in Example of Synthesis 2 was introduced into a three-necked flask which had been sufficiently dried and charged with nitrogen, wherein 100 ml of toluene, which had been subjected to distillation drying twice, was dropwise added while stirring within nitrogen stream to thereby prepare a polysilane solution.

Then, the polysilane solution was transferred into a spin coating device placed in a glove box charged with nitrogen, wherein a 1.0 μm thick film comprising the polysilane composition was formed on a No. 7059 glass (1 inch×3 inches in size) manufactured by Corning Glass Works Company as a substrate.

The polysilane film was set to a film holder placed in a vacuum treating apparatus, wherein it was subjected to vacuum drying by heating the film holder to 40° C.

Then, gaseous $AsF_5$ was introduced into the vacuum treating apparatus until the inner pressure thereof became 500 Torr, and while maintaining this inner pressure, the polysilane film was exposed to an atmosphere comprising the $AsF_5$ for two hours, to thereby subject the polysilane film to doping treatment.

As for the remaining cases, the above procedures were repeated to conduct doping treatment, except for changing the inner pressure of the vacuum treatment apparatus to 300 Torr, 100 Torr, 50 Torr and 10 Torr respectively.

For each of the polysilane composition film samples obtained, measurement and evaluation were performed in the same manner as in Example 1-1. The results obtained were as shown in Table 6.

From the results obtained, it has been found that others than the film sample prepared with 10 Torr for the inner pressure of the vacuum treating apparatus exhibit good electric properties.

And, the adhesion and the scratch resisting property were good as well as those obtained in Example 1-1.

EXAMPLE 1-5

There were prepared six polysilane composition film samples with different amounts of the doping material in the same operations and procedures as in Example 1-1, except for using the polysilane compound (No. 13) synthesized in Example of Synthesis 13 instead of the polysilane compound (No. 1) and using $PF_5$ instead of the $AsF_5$ as the doping material.

For each of the samples obtained, measurement and evaluation were performed in the same manner as in Example 1-1. The results obtained were as shown in Table 6.

From the results obtained, it has been found that others than the film sample prepared with 10 Torr for the inner pressure of the vacuum treating apparatus exhibit good electric properties.

And, the adhesion and the scratch resisting property were as good as those obtained in Example 1-1.

EXAMPLE 1-6

In this example, there was prepared a polysilane composition of the present invention by the foregoing doping treatment method (3).

10 g of the polysilane compound (No. 11) obtained in Example of Synthesis 11 was introduced into a three-necked flask which had been sufficiently dried and charged with nitrogen, wherein 100 ml of toluene, which had been subjected to distillation drying twice, was dropwise added while stirring within nitrogen stream to thereby prepare a polysilane solution.

Then, the polysilane solution was transferred into a bar coating device placed in a glove box charged with nitrogen, wherein a 5.0 μm thick film comprising the polysilane composition was formed on a No. 7059 glass (1 inch×3 inches in size) manufactured by Corning Glass Works Company as a substrate.

After being sufficiently dried within nitrogen stream while heating to 30° C., the film was set to a vacuum evaporation apparatus, wherein an Al circle electrode of 3 mm in diameter was formed thereon by a resistance heating evaporation method. Pt wire was connected to the Pt circle electrode by a wire bonder, followed by connecting to the (+) voltage side of a regulated power supply with the use of a lead wire. The resultant was made to be a polysilane electrode.

Separately, 5 g of $SbF_5$ was dissolved in one liter of propylene carbonate to obtain an electrolytic solution. In the electrolytic solution thus prepared, a Pt plate electrode (20 mm×50 mm×1 mm in size) being connected to the (−) voltage side of the regulated power supply and the polysilane electrode prepared in the above were immersed, and doping treatment was performed for two hours while applying a constant voltage of 0.5 V between the two electrodes.

After termination of the doping treatment, the polysilane electrode was taken out, followed by subjecting to vacuum drying, to thereby prepare a polysilane composition film sample.

Then, the above procedures were repeated, except that the applied voltage was made to be 1 V, 5 V, 10 V and 50 V, to thereby prepare a plurality of polysilane composition film samples.

For each of the polysilane composition film samples obtained, measurement and evaluation were performed in the same manner as in Example 1-1. The results obtained were as shown in Table 7.

From the results obtained, it has been found that others than the film samples prepared with 0.5 V and 50 V for the applied voltage exhibit good electric properties.

And, the adhesion and the scratch resisting property were as good as those obtained in Example 1-1.

EXAMPLE 1-7

There were prepared five polysilane composition film samples with different amounts of the doping material in the same operations and procedures as in Example 1-6, except for using the polysilane compound (No. 3) synthesized in Example of Synthesis 3 instead of the polysilane compound (No. 11) and using $AsBr_3$ instead of the $SbF_5$ as the doping material.

For each of the samples obtained, measurement and evaluation were performed in the same manner as in Example 1-1. The results obtained were as shown in Table 7.

From the results obtained, it has been found that others than the film samples prepared with 0.5 V and 50 V for the applied voltage exhibit good electric properties.

And, the adhesion and the scratch resisting property were as good as those obtained in Example 1-1.

EXAMPLE 1-8

There were prepared five polysilane composition film samples with different amounts of the doping material in the same operations and procedures as in Example 1-6, except for using the polysilane compound (No. 7) synthesized in Example of Synthesis 7 instead of the polysilane compound (No. 11) and using $AsBr_3$ instead of the $SbF_5$ as the doping material.

For each of the samples obtained, measurement and evaluation were performed in the same manner as in Example 1-1. The results obtained were as shown in Table 7.

From the results obtained, it has been found that others than the film samples prepared with 0.5 V and 50 V for the applied voltage exhibit good electric properties.

And, the adhesion and the scratch resisting property were as good as those obtained in Example 1-1.

EXAMPLE 1-9

There was prepared a polysilane composition film sample in the same operations and procedures as in Example 1-3, except for using the polysilane compound (No. 4) synthesized in Example of Synthesis 4 instead of the polysilane compound (No. 9), $PCl_5$ instead of the $SbCl_3$ as the doping material, and a substrate made of stainless steel deposited with a 1 μm thick Ag film (5 inches × 5 inches in size, 1 mm in thickness) instead of the No. 7059 glass manufactured by Corning Glass Works Company as the substrate. Wherein, the amount of the dopant liquid to be dropwise added was made to be 500 μl.

Successively, a 100 Å thick Au thin film of 5 mm in diameter was deposited on the polysilane composition film by an electron beam evaporation method. Then, current outputting lead wire was bonded to the Au thin film by a wire bonder. Diode characteristics of the resultant were evaluated by a pA METER HP 4140B.

As a result, the diode factor was $n = 1.40 \pm 0.05$, and good diode characteristics were provided.

EXAMPLE 1-10

There were prepared a plurality of polysilane composition film samples in the same operations and procedures as in Example 1-4, except for using the polysilane compound (No. 14) synthesized in Example of Synthesis 14 instead of the polysilane compound (No. 2), and a substrate made of stainless steel, which had been treated in the same way as in Example 1-9, as the substrate. Wherein, the inner pressure of the vacuum treating apparatus was controlled to be 100 Torr.

Successively, a 100 Å thick Au thin film of 5 mm in diameter was deposited on each of the polysilane composition films by an electron beam evaporation method. Then, current outputting lead wire was bonded to the Au thin film by a wire bonder. Diode characteristics of each of the resultants were evaluated by a pA METER HP 4140B.

As a result, the diode factor was $n = 1.35 \pm 0.05$, and good diode characteristics were provided.

EXAMPLE 1-11

There were prepared a plurality of polysilane composition film samples in the same operations and procedures as in Example 1-6, except for using the polysilane compound (No. 8) synthesized in Example of Synthesis 8 instead of the polysilane compound (No. 11), and a substrate made of stainless steel, which had been treated in the same way as in Example 1-9, as the substrate. Wherein, the applied voltage was made to be 10 V.

Successively, a 100 Å thick Au thin film of 5 mm in diameter was deposited on each of the polysilane composition films by an electron beam evaporation method. Then, current outputting lead wire was bonded to the Au thin film by a wire bonder. Diode characteristics of each of the resultants were evaluated by a pA METER HP 4140B.

As a result, the diode factor was $n = 1.40 \pm 0.05$, and good diode characteristics were provided.

EXAMPLE 2-1

In this example, there was prepared a polysilane composition of the present invention by the foregoing doping treatment method (1).

10 g of the polysilane compound (No. 1) obtained in Example of Synthesis 1 was introduced into a three-necked flask which had been sufficiently dried and charged with nitrogen, wherein 100 ml of tetrahydrofuran, which had been subjected to distillation drying twice, was dropwise added while stirring within nitrogen stream to thereby prepare a polysilane solution. Separately, 5 g of N,N,N',N'-tetramethylphenylenediamine (TMPD) as a doping material was dissolved in 1000 ml of dehydrated benzene to prepare a dopant liquid (D-1). Then, 0.02 ml of the dopant liquid (D-1) was dropwise added to the polysilane solution within nitrogen stream in the three-necked flask, followed by stirring at room temperature for 30 minutes.

After the stirring being terminated, the resultant polysilane solution was transferred into a spin coating device placed in a glove box charged with nitrogen, wherein a 1.0 μm thick film comprising the polysilane composition was formed on a No. 7059 glass (1 inch × 3 inches in size) manufactured by Corning Glass Works Company as a substrate.

The film was subjected to vacuum drying treatment to obtain a specimen as Film Sample No. 1.

The above operations and procedures were repeated, except for changing the amount of the dopant liquid to be dropwise added to 0.2 ml, 2 ml, 20 ml, 200 ml and 500 ml respectively, there were prepared film specimens to be Film Samples Nos. 2 to 6 respectively comprising the polysilane composition.

Each of the specimens was set to a vacuum evaporation apparatus, wherein a 1000 Å thick comb-shaped electrode of 150 μm in gap width and 3 cm in length for measuring a conductivity and a 1000 Å thick parallel gap electrode of 100 μm in gap width and 5 mm in length for measuring a thermoelectric power were formed by an electron beam evaporation method, using Pt as an evaporation metal for forming such gap electrode at a vacuum of about $1 \times 10^{-5}$ Torr. At the time of evaporation, the specimen was not particularly heated.

The resultant was taken out, and a dark current was measured at an applied voltage of 30 V by using a pA METER HP 4140B to obtain a conductivity in dark $\sigma_d$ (S/cm). Further, a conduction type was observed by using a thermoelectric power measuring equipment. The measured results and the evaluated results were as shown in Table 8.

From these results, it has bee found that others than Samples Nos. 1 and 6 all exhibit good electric properties.

Further, there was performed a test to observe the adhesion of the film formed with the substrate by sticking a cellophane tape of 5 mm in width and 1 cm in length on the film comprising the polysilane composition, and 5 minutes after, removing the cellophane tape. As a result, any of the samples exhibited a good adhesion.

Further in addition, there was performed a scratching test by using a diamond needle. As a result, no scratch was observed until 2 g in stylus pressure.

EXAMPLE 2-2

There were prepared six polysilane composition film samples with different amounts of the doping material in the same operations and procedures as in Example 2-1, except for using the polysilane compound (No. 6) synthesized in Example of Synthesis 6 instead of the polysilane compound (No. 1).

For each of the samples obtained, measurement and evaluation were performed in the same manner as in Example 2-1. The results obtained were as shown in Table 8.

From the results obtained, it has been found that others than the film samples prepared with 0.02 ml and 500 ml in the amount of the dopant liquid to be dropwise added exhibit good electric properties.

And, the adhesion and the scratch resisting property were good as well as those obtained in Example 2-1.

EXAMPLE 2-3

There were prepared six polysilane composition film samples with different amounts of the doping material in the same operations and procedures in Example 2-1, except for using the polysilane compound (No. 11) synthesized in Example of Synthesis 11 instead of the polysilane compound (No. 1) and o-toluidine instead of the N,N,N',N'-tetramethylphenylenediamine as the doping material.

For each of the samples obtained, measurement and evaluation were performed in the same manner as in Example 2-1. The results obtained were as shown in Table 8.

From the results obtained, it has been found that others than the film samples prepared with 0.02 ml and 500 ml in the amount of the dopant liquid to be dropwise added exhibit good electric properties.

And, the adhesion and the scratch resisting property were good as well as those obtained in Example 2-1.

EXAMPLE 2-4

In this example, there was prepared a polysilane composition of the present invention by the foregoing doping treatment method (2).

10 g of the polysilane compound (No. 2) obtained in Example of Synthesis 2 was introduced into a three-necked flask which had been sufficiently dried and charged with nitrogen, wherein 100 ml of toluene, which had been subjected to distillation drying twice, was dropwise added while stirring within nitrogen stream to thereby prepare a polysilane solution.

Then, the polysilane solution was transferred into a spin coating device placed in a glove box charged with nitrogen, wherein a 1.0 μm thick film comprising the polysilane composition was formed on a No. 7059 glass (1 inch × 3 inches in size) manufactured by Corning Glass Works Company as a substrate.

The polysilane film was set to a film holder placed in a vacuum treating apparatus, wherein it was subjected to vacuum drying by heating the film holder to 40° C.

Then, dimethylamine was introduced while being gasified into the vacuum treating apparatus until the inner pressure thereof became 500 Torr, and while maintaining this inner pressure, the polysilane film was exposed to an atmosphere comprising gas of the dimethylamine for two hours, to thereby subject the polysilane film to doping treatment.

As for the remaining cases, the above procedures were repeated to conduct the same doping treatment as in the above, except for changing the inner pressure of the vacuum treating apparatus to 300 Torr, 100 Torr, 50 Torr and 10 Torr respectively.

For each of the polysilane composition film samples obtained, measurement and evaluation were performed in the same manner as in Example 2-1. The results obtained were as shown in Table 9.

From the results obtained, it has been found that others than the film sample prepared with 10 Torr for the inner pressure of the vacuum treating apparatus exhibit good electric properties.

And, the adhesion and the scratch resisting property were good as well as those obtained in Example 2-1.

EXAMPLE 2-5

There were prepared six polysilane composition film samples with different amounts of the doping material in the same operations and procedures as in Example 2-4, except for using the polysilane compound (No. 8) synthesized in Example of Synthesis 8 instead of the polysilane compound (No. 2).

For each of the samples obtained, measurement and evaluation were performed in the same manner as in Example 2-1. The results obtained were as shown in Table 9.

From the results obtained, it has been found that others than the film sample prepared with 10 Torr for the inner pressure of the vacuum treating apparatus exhibit good electric properties.

And, the adhesion and the scratch resisting property were good as well as those obtained in Example 2-1.

EXAMPLE 2-6

In this example, there was prepared a polysilane composition of the present invention by the foregoing doping treatment method (3).

10 g of the polysilane compound (No. 12) obtained in Example of Synthesis 12 was introduced into a three-necked flask which had been sufficiently dried and charged with nitrogen, wherein 100 ml of toluene, which had been subjected to distillation drying twice, was dropwise added while stirring within nitrogen stream to thereby prepare a polysilane solution.

Then, the polysilane solution was transferred into a bar coating device placed in a glove box charged with nitrogen, wherein a 5.0 µm thick film comprising the polysilane composition was formed on a No. 7059 glass (1 inch × 3 inches in size) manufactured by Corning Glass Works Company as a substrate.

After being sufficiently dried within nitrogen stream while heating to 30° C., the film was set to a vacuum evaporation apparatus, wherein an Al circle electrode of 3 mm in diameter was formed thereon by a resistance heating evaporation method. Pt wire was connected to the Pt circle electrode by a wire bonder, followed by connecting to the (−) voltage side of a regulated power supply with the use of a lead wire. The resultant was made to be a polysilane electrode.

Separately, 5 g of N,N,N',N'-tetramethylphenylenediamine was dissolved in one liter of propylene carbonate to obtain an electrolytic solution. In the electrolytic solution thus prepared, a Pt plate electrode (20 mm × 50 mm × 1 mm in size) being connected to the (+) voltage side of the regulated power supply and the polysilane electrode prepared in the above were immersed, and doping treatment was performed for two hours while applying a constant voltage of 0.5 V between the two electrodes.

After termination of the doping treatment, the polysilane electrode was taken out, followed by subjecting to vacuum drying, to thereby prepare a polysilane composition film sample.

Then, the above procedures were repeated, except that the applied voltage was made to be 1 V, 5 V, 10 V and 50 V, to thereby prepare a plurality of polysilane composition film samples.

For each of the polysilane composition film samples obtained, measurement and evaluation were performed in the same manner as in Example 2-1. The results obtained were as shown in Table 10.

From the results obtained, it has been found that others than the film samples prepared with 0.5 V and 50 V for the applied voltage exhibit good electric properties.

And, the adhesion and the scratch resisting property were good as well as those obtained in Example 2-1.

EXAMPLE 2-7

There were prepared five polysilane composition film samples with different amounts of the doping material in the same operations and procedures as in Example 2-6, except for using the polysilane compound (No. 4) synthesized in Example of Synthesis 4 instead of the polysilane compound (No. 12) and triphenylamine instead of the N,N,N',N'-tetramethylphenylenediamine as the doping material.

For each of the samples obtained, measurement and evaluation were performed in the same manner as in Example 2-1. The results obtained were as shown in Table 10.

From the results obtained, it has been found that others than the film samples prepared with 0.5 V and 50 V for the applied voltage exhibit good electric properties.

And, the adhesion and the scratch resisting property were good as well as those obtained in Example 2-1.

EXAMPLE 2-8

There were prepared five polysilane composition film samples with different amounts of the doping material in the same operations and procedures as in Example 2-6, except for using the polysilane compound (No. 9) synthesized in Example of Synthesis 9 instead of the polysilane compound (No. 12) and o-toluidine instead of the N,N,N',N'-tetramethylphenylenediamine as the doping material.

For each of the samples obtained, measurement and evaluation were performed in the same manner as in Example 2-1. The results obtained were as shown in Table 10.

From the results obtained, it has been found that others than the film samples prepared with 0.5 V and 50 V for the applied voltage exhibit good electric properties.

And, the adhesion and the scratch resisting property were good as well as those obtained in Example 2-1.

EXAMPLE 2-9

There was prepared a polysilane composition film sample in the same operations and procedures as in Example 2-1, except for using the polysilane compound (No. 7) synthesized in Example of Synthesis 7 instead of the polysilane compound (No. 1), triphenylamine instead of the N,N,N',N'-tetramethylphenylenediamine as the doping material, and a substrate made of stainless steel deposited with a 1 µm thick Ag film (5 inches × 5 inches in size, 1 mm in thickness) instead of the No. 7059 glass manufactured by Corning Glass Works Company as the substrate. Wherein, the amount of the dopant liquid to be dropwise added was made to be 200 ml.

Successively, a 100 Å thick Au thin film of 5 mm in diameter was deposited on the polysilane composition film by an electron beam evaporation method. Then, current outputting lead wire was bonded to the Au thin film by a wire bonder. Diode characteristics of the resultant were evaluated by a pA METER HP 4140B.

As a result, the diode factor was n = 1.35 ± 0.05, and good diode characteristics were provided.

EXAMPLE 2-10

There were prepared a plurality of polysilane composition film samples in the same operations and procedures as in Example 2-4, except for using the polysilane compound (No. 10) synthesized in Example of Synthesis 10 instead of the polysilane compound (No. 2), and a substrate made of stainless steel, which had been treated in the same way as in Example 2-9, as the substrate. Wherein, the inner pressure of the vacuum treating apparatus was controlled to be 100 Torr.

Successively, a 100 Å thick Pt thin film of 5 mm in diameter was deposited on each of the polysilane composition films by an electron beam evaporation method. Then, current outputting lead wire was bonded to the Pt thin film by a wire bonder. Diode characteristics of each of the resultants were evaluated by a pA METER HP 4140B.

As a result, the diode factor was n=1.30±0.05 and good diode characteristics were provided.

EXAMPLE 2-11

There were prepared a plurality of polysilane composition film samples in the same operations and procedures as in Example 2-6, except for using the polysilane compound (No. 14) synthesized in Example of Synthesis 14 instead of the polysilane compound (No. 12), and a substrate made of stainless steel, which had been treated in the same way as in Example 2-9, as the substrate. Wherein, the applied voltage was made to be 10 V.

Successively, a 100 Å thick Pt thin film of 5 mm in diameter was deposited on each of the polysilane composition films by an electron beam evaporation method. Then, current outputting lead wire was bonded to the Pt thin film by a wire bonder. Diode characteristics of each of the resultants were evaluated by a pA METER HP 4140B.

As a result, the diode factor was n=1.30±0.05 and good diode characteristics were provided.

TABLE 1

|  | dichlorosilane monomer | terminal group treating agent |
|---|---|---|
| Example of synthesis 4 | a-7 0.1 mole | b-8 0.01 mole |
| Example of synthesis 5 | a-7 0.1 mole | b-5 0.01 mole |
| Comparative example of synthesis 1 | a-7 0.1 mole | — |

TABLE 2

|  | dichlorosilane monomer | dichlorosilane condensation period (minute) | terminal group treating agent |
|---|---|---|---|
| Example of synthesis 6 | a-13 0.1 mole | 180 | b-3 0.01 mole |
| Example of synthesis 7 | a-13 0.1 mole | 120 | b-7 0.01 mole |
| Example of synthesis 8 | a-13 0.1 mole | 90 | b-12 0.01 mole |
| Example of synthesis 9 | a-13 0.1 mole | 60 | b-8 0.01 mole |
| Example of synthesis 10 | a-13 0.1 mole | 30 | b-5 0.01 mole |
| Comparative example of synthesis 2 | a-13 0.1 mole | 10 | b-3 0.01 mole |

TABLE 3

|  | dichlorosilane monomer |  | terminal group treating agent |
|---|---|---|---|
| Example of synthesis 11 | a-1 0.05 mole | a-7 0.05 mole | b-15 0.01 mole |
| Example of synthesis 12 | a-1 0.05 mole | a-7 0.05 mole | b-7 0.01 mole |
| Example of synthesis 13 | a-7 0.05 mole | a-19 0.05 mole | b-3 0.01 mole |
| Example of synthesis 14 | a-7 0.05 mole | a-19 0.05 mole | b-8 0.01 mole |
| Comparative example of synthesis 3 | $(CH_3)_2SiCl_2$ 0.1 mole | — | — |
| Comparative example of synthesis 4 | $(C_6H_5)_2SiCl_2$ 0.1 mole | — | — |

TABLE 4

| polysilane compound No. | formula $A\!+\!Si\!\frac{R_1}{R_2}\!\frac{}{}_n\!+\!Si\!\frac{R_3}{R_4}\!\frac{}{}_m\!A$ | yield [%] | M.W. | FT-NMR Hδ [ppm] | | FT-IR [cm$^{-1}$] | |
|---|---|---|---|---|---|---|---|
| Example 1 | $CH_3(CH_2)_5\!+\!Si(CH_3)(C_6H_5)\!\frac{}{}_{1.0}\!(CH_2)_5CH_3$ | 65 | 75,000 | Si—CH$_3$ | 0.60 | Si—CH$_3$ | 2960, 2862 |
|  |  |  |  | Si—C$_6$H$_5$ | 7.21 | Si—C$_6$H$_5$ | 1610, 1433, 1020 |
|  |  |  |  | —CH$_3$ | 1.10 | —CH$_3$ | 1470 |
|  |  |  |  | Si—CH$_2$ | 1.10 | ⫶CH$_2$⫶ | 1456 |
|  |  |  |  | ⫶CH$_2$⫶$_4$ | 1.61 |  |  |
| Example 2 | $C_6H_5\!+\!Si(CH_3)(C_6H_5)\!\frac{}{}_{1.0}\!C_6H_5$ | 72 | 92,000 | Si—CH$_3$ | 0.60 | Si—CH$_3$ | 2960, 2862 |
|  |  |  |  | Si—C$_6$H$_5$ | 7.21 | Si—C$_6$H$_5$ | 1610, 1434, 1022 |
|  |  |  |  |  |  | Si—(C$_6$H$_5$)$_2$ | 735 |
| Example 3 | $C_6H_5\!-\!CH_2\!+\!Si(CH_3)(C_6H_5)\!\frac{}{}_{1.0}\!CH_2\!-\!C_6H_5$ | 61 | 47,000 | Si—CH$_3$ | 0.60 | Si—CH$_3$ | 2960, 2861 |
|  |  |  |  | Si—C$_6$H$_5$ | 7.21 | Si—C$_6$H$_5$ | 1610, 1434, 1022 |
|  |  |  |  | Si—CH$_2$— | 1.78 | Si—CH$_2$— | 1456 |
|  |  |  |  | —CH$_2$—C$_6$H$_5$ | 7.25 |  |  |
| Example 4 | $CH_3\!-\!C_6H_4\!+\!Si(CH_3)(C_6H_5)\!\frac{}{}_{1.0}\!C_6H_4\!-\!CH_3$ | 60 | 51,000 | Si—CH$_3$ | 0.60 | Si—CH$_3$ | 2960, 2861 |
|  |  |  |  | Si—C$_6$H$_5$ / Si—C$_6$H$_4$ | 7.20 | Si—C$_6$H$_5$ / Si—C$_6$H$_4$— | 1610, 1434, 1022 / 1455 |
|  |  |  |  | —C$_6$H$_4$—CH$_3$ | 2.26 | —C$_6$H$_4$—CH$_3$ |  |

TABLE 4-continued

| polysilane compound No. | formula $A-(\underset{R_2}{\overset{R_1}{Si}})_n-(\underset{R_4}{\overset{R_3}{Si}})_m-A$ | yield [%] | M.W. | FT-NMR Hδ [ppm] | FT-IR [cm⁻¹] |
|---|---|---|---|---|---|
| Example 5 | (CH₃, cyclohexyl, phenyl)-Si structure, n=1.0 | 62 | 49,000 | Si—CH₃ 0.60; Si—phenyl 7.20; Si—cyclohexyl 2.03, 1.57 | Si—CH₃ 2960, 2862; Si—phenyl 1610, 1434, 1020; Si—cyclohexyl 2930, 1355, 1170 |
| Comparative example 1 D-1 | Cl—Si(CH₃)(phenyl)—Cl, n=1.0 | 60 | 46,000 | Si—CH₃ 0.60; Si—phenyl 7.20 | Si—CH₃ 2960, 2862; Si—phenyl 1610, 1434, 1020; Si—Cl 530; Si—O—Si 1110 |
| Example 6 | CH₃(CH₂)₅—Si(CH₃)(cyclohexyl)—(CH₂)₅CH₃, n=1.0 | 58 | 120,000 | Si—CH₃ 0.60; Si—cyclohexyl 1.58, 2.04; Si—CH₂— 1.10; —CH₃ ; —(CH₂)₅— 1.6 | Si—CH₃ 2960, 2880; Si—cyclohexyl 2930, 2958, 1450, 1170; C—CH₃ 1470 |
| Example 7 | (phenyl)₂Si(CH₃)(cyclohexyl), n=1.0 | 61 | 72,000 | Si—CH₃ 0.60; Si—cyclohexyl 1.58, 2.04; Si—phenyl 7.22 | Si—CH₃ 2960, 2881; Si—cyclohexyl 2930, 2958, 1451, 1172; Si—phenyl 1600, 1434, 1022 |
| Example 8 | (phenyl-CH₂)—Si(CH₃)(cyclohexyl)—(CH₂-phenyl), n=1.0 | 72 | 69,000 | Si—CH₃ 0.60; Si—cyclohexyl 1.58, 2.04; Si—CH₂— 1.78; CH₂—phenyl 7.25 | Si—CH₃ 2960, 2880; Si—cyclohexyl 2930, 2958, 1451, 1172; Si—CH₂— 1456; CH₂—phenyl 1590 |
| Example 9 | (CH₃-phenyl)—Si(CH₃)(cyclohexyl)—(phenyl-CH₃), n=1.0 | 45 | 46,000 | Si—CH₃ 0.60; Si—cyclohexyl 1.58, 2.04; Si—(phenyl) 7.20; phenyl—CH₃ 2.26 | Si—CH₃ 2960, 2880; Si—cyclohexyl 2930, 2958, 1451, 1172; Si—(phenyl) 1630, 1455; phenyl—CH₃ 1455 |
| Example 10 | (cyclohexyl)₂Si(CH₃)(cyclohexyl), n=1.0 | 50 | 8,000 | Si—CH₃ 0.60; Si—cyclohexyl 1.58, 2.04 | Si—CH₃ 2960, 2880; Si—cyclohexyl 2930, 2958, 1451, 1172 |
| Comparative example 2 D-2 | CH₃(CH₂)₅—Si(CH₃)(cyclohexyl)—(CH₂)₅CH₃, n=1.0 | 30 | 3,000 | Si—CH₃ 0.60; Si—cyclohexyl 1.58, 2.04; Si—CH₂— 1.10; —CH₃ ; —(CH₂)₅— 1.60 | Si—CH₃ 2960, 2880; Si—cyclohexyl 2930, 2958, 1450, 1170; C—CH₃ 1470 |
| Example 11 | CH₃(CH₂)₁₀—Si(CH₃)(cyclohexyl)₀.₅—Si(CH₃)₂₀.₅—(CH₂)₁₀CH₃ | 55 | 71,000 | Si—CH₃ 0.60; Si—cyclohexyl 1.58, 2.04; Si—CH₂— 1.10; —CH₃ ; —(CH₂)₁₀— 1.60 | Si—CH₃ 2960, 2880; Si—cyclohexyl 2930, 2958, 1450, 1170; C—CH₃ 1470 |

TABLE 4-continued

| polysilane compound No. | formula $A(\underset{R_2}{\overset{R_1}{Si}})_n(\underset{R_4}{\overset{R_3}{Si}})_m A$ | yield [%] | M.W. | FT-NMR Hδ [ppm] | FT-IR [cm$^{-1}$] |
|---|---|---|---|---|---|
| Example 12 | 12 — structure: $(-Si(CH_3)(C_6H_5)-)_{0.5}(-Si(CH_3)(C_6H_{11})-)_{0.5}$ with terminal phenyl and cyclohexyl groups | 60 | 59,000 | Si—CH$_3$ 0.60; Si—C$_6$H$_{11}$ 1.58, 2.04; Si—C$_6$H$_5$ 7.22 | Si—CH$_3$ 2960, 2881; Si—C$_6$H$_{11}$ 2931, 2958, 1451, 1172; Si—C$_6$H$_5$ 1600, 1434, 1022 |
| Example 13 | 13 — $CH_3(CH_2)_5(Si(CH_3)(C_6H_{11}))_{0.5}(Si((CH_2)_3CH_3)((CH_2)_3CH_3))_{0.5}(CH_2)_5CH_3$ | 63 | 69,000 | Si—CH$_3$ 0.60; Si—C$_6$H$_{11}$ 1.58, 2.04; Si—CH$_2$—CH$_3$ 1.10; —(CH$_2$)$_{10}$— 1.60 | Si—CH$_3$ 2960, 2880; Si—C$_6$H$_{11}$ 2930, 2958, 1450, 1170; C—CH$_3$ 1470 |
| Example 14 | 14 — $CH_3$-C$_6$H$_4$-$(Si(CH_3)(C_6H_{11}))_{0.5}(Si((CH_2)_3CH_3)((CH_2)_3CH_3))_{0.5}$-C$_6$H$_4$-$CH_3$ | 62 | 58,000 | Si—CH$_3$ 0.60; Si—C$_6$H$_{11}$ 1.58, 2.04; Si—CH$_2$—CH$_3$ 1.10; —(CH$_2$)$_3$— 1.60; Si—C$_6$H$_4$—CH$_3$ 7.20; —C$_6$H$_4$—CH$_3$ 2.26 | Si—CH$_3$ 2961, 2880; Si—C$_6$H$_{11}$ 2931, 2958, 1450, 1170; C—CH$_3$ 1470; Si—C$_6$H$_4$—CH$_3$ 1630, 1455 |
| Comparative example 3 | D-3 — $Cl(Si(CH_3)_2)_{1.0}Cl$ | 30 | — | — | Si—CH$_3$ 2960, 2880; Si—Cl 530; Si—O—Si 1110 |
| Comparative example 4 | D-4 — $Cl(Si(C_6H_5)_2)_{1.0}Cl$ | 25 | — | — | Si—C$_6$H$_5$ 1610, 1434, 1020; Si—Cl 528; Si—O—Si 1110 |

TABLE 5

| | the amount of the dopant liquid to be dropwise added | | | | | |
|---|---|---|---|---|---|---|
| Example | 0.02 μl | 0.5 μl | 5 μl | 500 μl | 3 ml | 5 ml |
| 1-1 | <1.0 × 10$^{-14}$<br>i | 1.5 × 10$^{-7}$<br>p$^-$ | 2.0 × 10$^{-6}$<br>p | 9.0 × 10$^{-5}$<br>p | 2.5 × 10$^{-3}$<br>p$^+$ | 8.5 × 10$^{-3}$<br>— |
| 1-2 | <1.0 × 10$^{-14}$<br>i | 1.0 × 10$^{-7}$<br>p$^-$ | 1.5 × 10$^{-6}$<br>p | 6.5 × 10$^{-5}$<br>p | 1.0 × 10$^{-3}$<br>p$^+$ | 7.0 × 10$^{-3}$<br>— |
| 1-3* | <1.0 × 10$^{-14}$<br>i | 9.0 × 10$^{-8}$<br>p$^-$ | 8.0 × 10$^{-7}$<br>p$^-$ | 1.5 × 10$^{-5}$<br>p | 9.5 × 10$^{-4}$<br>p | 4.5 × 10$^{-3}$<br>— |

*the amount of the dopant liquid to be dropwise added in Example 3-1 was 5 μl, 10μl, 100 μl, 1 ml, 10 ml and 50 ml.

$$\left[\begin{array}{c}\text{upper column: }\sigma_d(S/cm)\\\text{lower column: conduction tipe}\end{array}\right]$$

—: could not be identified

TABLE 6

| | the inner pressure of the vacuum treating apparatus (Torr) | | | | |
|---|---|---|---|---|---|
| Example | 10 | 50 | 100 | 300 | 500 |
| 1-4 | <1.0 × 10$^{-14}$<br>i | 5.5 × 10$^{-9}$<br>p$^-$ | 1.5 × 10$^{-8}$<br>p$^-$ | 2.0 × 10$^{-7}$<br>p | 1.5 × 10$^{-6}$<br>p |
| 1-5 | <1.0 × 10$^{-14}$ | 7.0 × 10$^{-9}$ | 3.0 × 10$^{-8}$ | 8.0 × 10$^{-7}$ | 6.5 × 10$^{-6}$ |

TABLE 6-continued

| | the inner pressure of the vacuum treating apparatus (Torr) | | | | |
|---|---|---|---|---|---|
| Example | 10 | 50 | 100 | 300 | 500 |
| | i | $p^-$ | $p^-$ | p | p |

[ upper column: $\sigma_d$(S/cm) / lower column: conduction tipe ]

—: could not be identified

TABLE 7

| | applied voltage (V) | | | | |
|---|---|---|---|---|---|
| Example | 0.5 | 1 | 5 | 10 | 50 |
| 1-6 | $<1.0 \times 10^{-14}$ | $2.0 \times 10^{-8}$ | $1.0 \times 10^{-6}$ | $1.5 \times 10^{-5}$ | $3.0 \times 10^{-4}$ |
| | i | $p^-$ | p | p | — |
| 1-7 | $<1.0 \times 10^{-14}$ | $1.5 \times 10^{-8}$ | $8.0 \times 10^{-7}$ | $9.0 \times 10^{-6}$ | $1.5 \times 10^{-4}$ |
| | i | $p^-$ | $p^-$ | p | — |
| 1-8 | $<1.0 \times 10^{-14}$ | $3.0 \times 10^{-8}$ | $9.5 \times 10^{-7}$ | $1.0 \times 10^{-5}$ | $1.0 \times 10^{-4}$ |
| | i | $p^-$ | $p^-$ | p | — |

[ upper column: $\sigma_d$(S/cm) / lower column: conduction tipe ]

—: could not be identified

TABLE 8

| | the amount of the dopant liquid to be dropwise added (ml) | | | | | |
|---|---|---|---|---|---|---|
| Example | 0.02 | 0.2 | 2 | 20 | 200 | 500 |
| 2-1 | $<1.0 \times 10^{-14}$ | $5.0 \times 10^{-7}$ | $1.5 \times 10^{-6}$ | $7.0 \times 10^{-5}$ | $3.5 \times 10^{-3}$ | $1.5 \times 10^{-2}$ |
| | i | $n^-$ | n | n | $n^+$ | — |
| 2-2 | $<1.0 \times 10^{-14}$ | $4.0 \times 10^{-7}$ | $2.5 \times 10^{-6}$ | $6.0 \times 10^{-5}$ | $3.0 \times 10^{-3}$ | $1.0 \times 10^{-2}$ |
| | i | $n^-$ | n | n | n | — |
| 2-3 | $<1.0 \times 10^{-14}$ | $8.0 \times 10^{-8}$ | $9.5 \times 10^{-7}$ | $7.5 \times 10^{-6}$ | $9.0 \times 10^{-4}$ | $8.5 \times 10^{-3}$ |
| | i | $n^-$ | $n^-$ | n | n | — |

[ upper column: $\sigma_d$(S/cm) / lower column: conduction tipe ]

—: could not be identified

TABLE 9

| | the inner pressure of the vacuum treating apparatus (Torr) | | | | |
|---|---|---|---|---|---|
| Example | 10 | 50 | 100 | 300 | 500 |
| 2-4 | $<1.0 \times 10^{-14}$ | $6.0 \times 10^{-9}$ | $3.5 \times 10^{-8}$ | $1.5 \times 10^{-7}$ | $9.5 \times 10^{-6}$ |
| | i | $n^-$ | n | n | n |
| 2-5 | $<1.0 \times 10^{-14}$ | $8.5 \times 10^{-9}$ | $6.5 \times 10^{-8}$ | $3.0 \times 10^{-7}$ | $1.0 \times 10^{-5}$ |
| | i | $n^-$ | n | n | n |

[ upper column: $\sigma_d$(S/cm) / lower column: conduction tipe ]

—: could not be identified

TABLE 10

| | applied voltage (V) | | | | |
|---|---|---|---|---|---|
| Example | 0.5 | 1 | 5 | 10 | 50 |
| 2-6 | $<1.0 \times 10^{-14}$ | $8.0 \times 10^{-8}$ | $3.0 \times 10^{-6}$ | $7.0 \times 10^{-5}$ | $1.5 \times 10^{-3}$ |
| | i | $n^-$ | n | n | — |
| 2-7 | $<1.0 \times 10^{-14}$ | $6.0 \times 10^{-8}$ | $2.5 \times 10^{-6}$ | $3.5 \times 10^{-5}$ | $8.5 \times 10^{-4}$ |
| | i | n | n | n | — |
| 2-8 | $<1.0 \times 10^{-14}$ | $4.5 \times 10^{-8}$ | $3.0 \times 10^{-6}$ | $1.0 \times 10^{-5}$ | $9.0 \times 10^{-4}$ |
| | i | $n^-$ | n | n | — |

[ upper column: $\sigma_d$(S/cm) / lower column: conduction tipe ]

—: could not be identified

We claim:

1. A polysilane composition comprising a polysilane compound for forming film having a weight average molecular weight of 6000 to 200000 said polysilane compound being free from chlorine and oxygen containing groups and which is represented by the following general formula (I) and at leash either an acceptor level forming material comprising a halogen compound represented by the general formula: MXa wherein, M is an element belonging to the group VA of the periodic table, X is halogen element, and a is an integer whose value is determined by the valence number of said element M or a donor level forming material comprising an amine compound, in which the content of said acceptor level forming material or said donor level forming material or the total content of a combination of said acceptor level forming material and said donor level forming material is $1 \times 10^{-4}$ to 10 parts by weight versus 100 parts by weight of said polysilane compound,

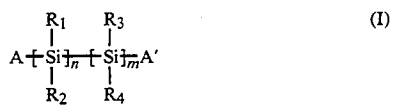

wherein, $R_1$ is an alkyl group of 1 to 2 carbon atoms; $R_2$ is an alkyl group, cycloalkyl group, aryl group or aralkyl group of 3 to 8 carbon atoms; $R_3$ is an alkyl group of 1–4 carbon atoms; $R_4$ is an alkyl group of 1 to 4 carbon atoms; A and A' respectively are an alkyl group, cycloalkyl group, aryl group or aralkyl group of 4 to 12 carbon atoms wherein the two substituents may be the same or different one from the other; and each of n and m is a mole ratio showing the proportion of the number of respective monomers versus the total of the monomers in the polymer wherein $n+m=1$, $0 < n \leq 1$ and $0 \leq m < 1$.

2. A polysilane composition as defined in claim 1, wherein the weight average molecular weight of the polysilane compound is 8000 to 120000.

3. A polysilane composition as defined in claim 1, wherein each of the A and A' in the polysilane compound represented by the general formula (I) is an alkyl group or a cycloalkyl group of 5 to 12 carbon atoms.

4. A polysilane composition as defined in claim 1, wherein the element belonging to the group VA is an element selected from the group consisting of N, P, As and Sb.

5. A polysilane composition as defined in claim 1, wherein the halogen element is F, Cl, Br or I.

6. A polysilane composition as defined in claim 1, wherein the halogen compound represented by the general formula: MXa is a compound selected from the group consisting of $NF_3$, $NF_5$, $NCl_3$, $NCl_5$, $NBr_3$, $NB_5$, $NI_3$, $PF_3$, $PF_5$, $PCl_3$, $PCl_5$, $PBr_3$, $PBr_5$, $PI_3$, $AsF_3$, $AsF_5$, $AsCl_3$, $AsBr_3$, $AsI_3$, $SbF_3$, $SbF_5$, $SbCl_3$, $SbCl_5$, $SbBr_3$ and $SbI_3$.

7. A polysilane composition as defined in claim 1, wherein the amine compound is a compound selected from the group consisting of aliphatic amines, aliphatic unsaturated amines, alicyclic amines, and aromatic amines.

8. A polysilane composition as defined in claim 7, wherein the amine compound is a compound selected from the group consisting of allylamine, diallylamine, triallylamine, cyclopropylamine, cyclobutylamine, cyclopentylamine, cyclohexylamine, aniline, methylaniline, dimethylaniline, ethylaniline, diethylaniline, o-, m-, and p-toluidines, benzylamine, dibenzylamine, tribenzylamine, diphenylamine, triphenylamine, -naphthylamine, β-naphthylamine, O-, m-, and p-phenylenediamines, and tetramethyl-p-phenylenediamine (TMPD).

* * * * *

UNITED STATES PATENT AND TRADEMARK OFFICE
CERTIFICATE OF CORRECTION

PATENT NO. : 5,358,987
DATED : October 25, 1994
INVENTOR(S) : Masahiro Kanai et al It is certified that error appears in the above-indentified patent and that said Letters Patent is hereby corrected as shown below:

On the title page: Item [75] Inventors: :"Masahumi Sano" should read -- Masafumi Sano --.

COLUMN 1

Line 10, "in which" should read --with--.
Line 30, "119550 )." should read --119550).--.
Line 47, "formation. There" should read --formation. ¶ There--.

COLUMN 2

Line 8, "(1984)))." should read --(1984)).--.
Line 49, "is" should be deleted.

COLUMN 3

Line 14, "compound." should read --compound:--.
Line 26, "stands" should read --stand--.

COLUMN 4

Line 64, "is" should read --are--.

UNITED STATES PATENT AND TRADEMARK OFFICE
CERTIFICATE OF CORRECTION

PATENT NO. : 5,358,987
DATED : October 25, 1994
INVENTOR(S) : MASAHIRO KANAI ET AL.

It is certified that error appears in the above-indentified patent and that said Letters Patent is hereby corrected as shown below:

COLUMN 5

Line 17, "the for" should read --the--.
Line 45, "capable" should read --capable of--.
Line 58, "represented" should read --is represented--.
Line 60, "represented" should read --is represented--.

COLUMN 6

Line 61, "firstly" should read --first--.

COLUMN 7

Line 32, "$0<n\leq$" should read --$0<n\leq 1$--.
Line 40, "holds" should read --folds--.
Line 54, "and" should read --AND--.

COLUMN 15

Line 61, "represents" should read --represent--.

COLUMN 16

Line 9, "by-pass" should read --bypass--.

COLUMN 17

Line 36, "by-pass" should read --bypass--.

UNITED STATES PATENT AND TRADEMARK OFFICE
CERTIFICATE OF CORRECTION

PATENT NO. : 5,358,987
DATED : October 25, 1994
INVENTOR(S) : MASAHIRO KANAI ET AL.

It is certified that error appears in the above-indentified patent and that said Letters Patent is hereby corrected as shown below:

COLUMN 18

Line 19, "were" should read --was--.

COLUMN 20

Line 19, "alloyclio" should read --alicyclic--.
Line 38, "Gan" should read --can--.

COLUMN 21

Line 28, "set a" should read --set at a--.
Line 31, "be" should read --can be--.

COLUMN 22

Line 10, "being" should read --was--.
Line 22, ", there" should read --, and there--.
Line 25, "to" should read --in--.
Line 42, "bee" should read --been--.
Line 42, "others than" should read --aside from--.
Line 68, "others than the film samples" should read --film samples other than those--.

COLUMN 23

Line 9, "in" (second occurrence) should read --as in--.

UNITED STATES PATENT AND TRADEMARK OFFICE
CERTIFICATE OF CORRECTION

PATENT NO. : 5,358,987

DATED : October 25, 1994

INVENTOR(S) : Masahiro Kanai et al

It is certified that error appears in the above-indentified patent and that said Letters Patent is hereby corrected as shown below:

COLUMN 24

Line 2, "good as well" should read --as good--.

COLUMN 27

Line 24, "bee" should read --been--.
Line 54, "good as well" should read --as good--.

COLUMN 28

Line 6, "good as well" should read --as good--.
Line 50, "good as well" should read --as good--.

COLUMN 29

Line 56, "good as well" should read --as good--.

COLUMN 30

Line 8, "good as well" should read --as good--.
Line 28, "good as well" should read --as good.

COLUMN 31

Line 1, "n=1.30±0.05 and--. should read --n=1.30±0.05, and--.
Line 21, "n=1.30±0.05 and" should read --n=1.30±0.05, and--.

UNITED STATES PATENT AND TRADEMARK OFFICE
CERTIFICATE OF CORRECTION

PATENT NO. : 5,358,987
DATED : October 25, 1994
INVENTOR(S) : Masahiro Kanai et al It is certified that error appears in the above-indentified patent and that said Letters Patent is hereby corrected as shown below:

COLUMN 32

Table 2, "minuite" should read --minutes--.

COLUMN 37

Table 6, "tipe" should read --type--.
Table 7, "tipe" should read --type--.
Table 8, "tipe" should read --type--.
Table 9, "tipe" should read --type--.
Table 10, "tipe" should read --type--.
Line 67, "200000" should read --200000,--.

COLUMN 38

Line 66, "leash" should read --least--.

COLUMN 39

Line 2, "halogen" should read --a halogen--.

UNITED STATES PATENT AND TRADEMARK OFFICE
CERTIFICATE OF CORRECTION

PATENT NO. : 5,358,987
DATED : October 25, 1994
INVENTOR(S) : Masahiro Kanai et al It is certified that error appears in the above-indentified patent and that said Letters Patent is hereby corrected as shown below:

COLUMN 40

Line 30, "-naphthyl-" should read --α-naphthyl- --.
Line 31, "O-," should read --o-,--.

Signed and Sealed this

Sixth Day of June, 1995

Attest:

BRUCE LEHMAN

Attesting Officer

Commissioner of Patents and Trademarks